US010096474B2

(12) United States Patent
Mukherjee et al.

(10) Patent No.: US 10,096,474 B2
(45) Date of Patent: Oct. 9, 2018

(54) METHODS AND STRUCTURES TO PREVENT SIDEWALL DEFECTS DURING SELECTIVE EPITAXY

(71) Applicant: Intel Corporation, Santa Clara, CA (US)

(72) Inventors: Niloy Mukherjee, Portland, OR (US); Niti Goel, Portland, OR (US); Sanaz K. Gardner, Hillsboro, OR (US); Pragyansri Pathi, Portland, OR (US); Matthew V. Metz, Portland, OR (US); Sansaptak Dasgupta, Hillsboro, OR (US); Seung Hoon Sung, Beaverton, OR (US); James M. Powers, Beaverton, OR (US); Gilbert Dewey, Hillsboro, OR (US); Benjamin Chu-Kung, Portland, OR (US); Jack T. Kavalieros, Portland, OR (US); Robert S. Chau, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/604,550

(22) Filed: May 24, 2017

(65) Prior Publication Data
US 2017/0256408 A1 Sep. 7, 2017

Related U.S. Application Data

(63) Continuation of application No. 14/908,987, filed as application No. PCT/US2013/058084 on Sep. 4, 2013, now Pat. No. 9,698,013.

(51) Int. Cl.
*G06Q 30/02* (2012.01)
*H01L 21/02* (2006.01)
(Continued)

(52) U.S. Cl.
CPC .. *H01L 21/02694* (2013.01); *H01L 21/02381* (2013.01); *H01L 21/02516* (2013.01);
(Continued)

(58) Field of Classification Search
CPC ............... H01L 29/045; H01L 29/0653; H01L 29/0847; H01L 29/165; H01L 21/02381;
(Continued)

(56) References Cited

U.S. PATENT DOCUMENTS

2004/0089914 A1 5/2004 Mouli et al.
2004/0121407 A1 6/2004 Bude et al.
(Continued)

FOREIGN PATENT DOCUMENTS

CN 1735969 2/2006
KR 10-2004-0105980 12/2004
WO WO-2004044989 5/2004

OTHER PUBLICATIONS

Communication including Extended European Search Report (7 pages) dated Mar. 9, 2017 for European Patent Application No. 13892844.5, PCT/US2013/058084.
(Continued)

*Primary Examiner* — Shahed Ahmed
(74) *Attorney, Agent, or Firm* — Schwabe, Williamson & Wyatt P.C.

(57) ABSTRACT

Trenches (and processes for forming the trenches) are provided that reduce or prevent crystaline defects in selective epitaxial growth of type III-V or Germanium (Ge) material (e.g., a "buffer" material) from a top surface of a substrate material. The defects may result from collision of selective epitaxial sidewall growth with oxide trench sidewalls. Such trenches include (1) a trench having sloped sidewalls at an angle of between 40 degrees and 70 degrees (e.g., such as 55 degrees) with respect to a substrate surface; and/or (2) a
(Continued)

combined trench having an upper trench over and surrounding the opening of a lower trench (e.g., the lower trench may have the sloped sidewalls, short vertical walls, or tall vertical walls). These trenches reduce or prevent defects in the epitaxial sidewall growth where the growth touches or grows against vertical sidewalls of a trench it is grown in.

10 Claims, 17 Drawing Sheets

(51) Int. Cl.
    *H01L 21/762*     (2006.01)
    *H01L 29/08*     (2006.01)
    *H01L 29/06*     (2006.01)
    *H01L 29/04*     (2006.01)
    *H01L 21/8238*     (2006.01)
    *H01L 29/78*     (2006.01)
    *H01L 29/267*     (2006.01)
    *H01L 29/165*     (2006.01)
    *H01L 21/8258*     (2006.01)
    *H01L 27/092*     (2006.01)

(52) U.S. Cl.
CPC .. *H01L 21/02532* (2013.01); *H01L 21/02538* (2013.01); *H01L 21/02609* (2013.01); *H01L 21/02636* (2013.01); *H01L 21/02639* (2013.01); *H01L 21/76224* (2013.01); *H01L 21/823814* (2013.01); *H01L 21/823821* (2013.01); *H01L 21/823878* (2013.01); *H01L 29/045* (2013.01); *H01L 29/0653* (2013.01); *H01L 29/0847* (2013.01); *H01L 29/165* (2013.01); *H01L 29/267* (2013.01); *H01L 29/7848* (2013.01); *H01L 21/8258* (2013.01); *H01L 27/0924* (2013.01)

(58) Field of Classification Search
CPC ......... H01L 21/02516; H01L 21/02532; H01L 21/02538; H01L 21/02609; H01L 21/02636; H01L 21/02639; H01L 21/02694; H01L 21/823814; H01L 21/823821; H01L 21/823878; H01L 27/0924
USPC ........ 257/374, 501, 627, 628; 438/196, 221, 438/248, 150
See application file for complete search history.

(56) References Cited

U.S. PATENT DOCUMENTS

| | | |
|---|---|---|
| 2004/0121507 A1 | 6/2004 | Bude et al. |
| 2006/0292719 A1* | 12/2006 | Lochtefeld ........ H01L 21/02381 438/22 |
| 2007/0066074 A1 | 3/2007 | Rossi et al. |
| 2010/0163842 A1* | 7/2010 | Lai ................... H01L 29/66795 257/19 |
| 2010/0213511 A1 | 8/2010 | Lochtefeld et al. |
| 2010/0289116 A1 | 11/2010 | Lin et al. |
| 2011/0147812 A1 | 6/2011 | Steigerwald et al. |
| 2012/0032234 A1 | 2/2012 | Wang et al. |

OTHER PUBLICATIONS

Intel Corporation, International Preliminary Report on Patentability and Written Opinion for PCT/US2013/058084, dated Mar. 17, 2016.
Intel Corporation, International Search Report and Written Opinion dated Jun. 19, 2014 for International Application No. PCT/US2013/058084.
Intel Corporation, Office Action and Search Report for Taiwan Application No. 103130107, dated Feb. 18, 2016.
Wang, G., et al., "Growth of High Quality InP Layers in STI Trenches on Miscut Si (0 0 1) Substrates", Journal of Crystal Growth, vol. 315, (2011), pp. 32-36.
Office Action for Chinese Patent Application No. 201380078661.X dated Jan. 30, 2018, 10 pgs., no translation.
Notice of Allowance for Taiwanese Patent Application No. 103130107 dated Sep. 23, 2016, 2 pgs., no translation.

* cited by examiner

METHODS AND STRUCTURES TO PREVENT SIDEWALL DEFECTS DURING SELECTIVE EPITAXY

CROSS-REFERENCE TO RELATED APPLICATION

This patent application is a continuation of U.S. National Phase application Ser. No. 14/908,987 filed Jan. 29, 2016, under 35 U.S.C. § 371 of International Application No. PCT/US2013/058084, filed Sep. 4, 2013, entitled METHODS AND STRUCTURES TO PREVENT SIDEWALL DEFECTS DURING SELECTIVE EPITAXY

FIELD

Circuit devices and the manufacture and structure of fin based circuit devices.

DESCRIPTION OF RELATED ART

Increased performance in and yield of circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of metal oxide semiconductor (MOS) transistor devices, such as those used in a complementary metal oxide semiconductor (CMOS), it is often desired to increase movement of electrons in N-type MOS device (n-MOS) channels and to increase movement of positive charged holes in P-type MOS device (p-MOS) channels. However, performance and movement are slowed by lattice mismatches and defects generated in a between layers of materials used to form the MOS For some CMOS implementation, the co-integration of lattice mismatched materials like III-V material epitaxial growth on Silicon is a big challenge. Currently there is no state of art solution to co-integrate n- and p-MOS material epitaxial growths on to a single Silicon substrate. Thus, in current applications, due to large lattice mismatch in materials, defects are generated when novel materials (III-V, Germanium (Ge)) are grown on a Silicon material substrate.

DETAILED DESCRIPTION

Large lattice mismatch in materials may generate defects (e.g., defects in the crystal lattice of the material) when certain materials (e.g., type III-V, or Germanium (Ge) materials) are epitaxially grown on a Silicon material substrate (e.g., single crystal silicon). In some cases, the materials may be epitaxially grown from a substrate surface, and "selectively" grown on the surface in trenches between shallow trench isolation (STI) regions. Defect density improvements may be accomplished by growth optimizations/tricks in blanket film growths. However, there may not be a reduction of such defects for selective epitaxial material grown in a trench. If these defects propagate throughout the trench, they can lead to slower or decreased performance, reduced yield, and variation issues in circuit devices built on a device layer formed from epitaxial growth extending above the trench. This propagation may exist in "fin" devices (e.g., circuit devices) formed in fins that are patterned and etched from epitaxial growth (e.g., device material, regions or layers) extending above the trench. In some cases, a pair of device fins are patterned and etched from the growth, such as the growth extending above each trench. Such fin devices may include fin integrated circuit (IC) transistors, resistors, capacitors, etc. formed in or on sidewalls of "fins" grown from or extending above a semiconductor (e.g., silicon) substrate or other material. Such devices may include fin metal oxide semiconductor (MOS) transistor devices, such as those used in a complementary metal oxide semiconductor (CMOS) based on movement of electrons in N-type MOS device (n-MOS) channels and movement of positive charged holes in P-type MOS device (p-MOS) channels.

In some cases, a "buffer" material may be selectively epitaxially grown from a substrate surface, in the trenches. The buffer material may be grown or used so that crystalline defects are trapped or removed below a top surface of the buffer material. Then, a "device" material may be grown from the top surface of the buffer material. This way, the device material may have fewer or be free of such defects, thus providing faster or increased performance, increased yield, and fewer variation issues in circuit devices built on or in the device material.

Figure 1:
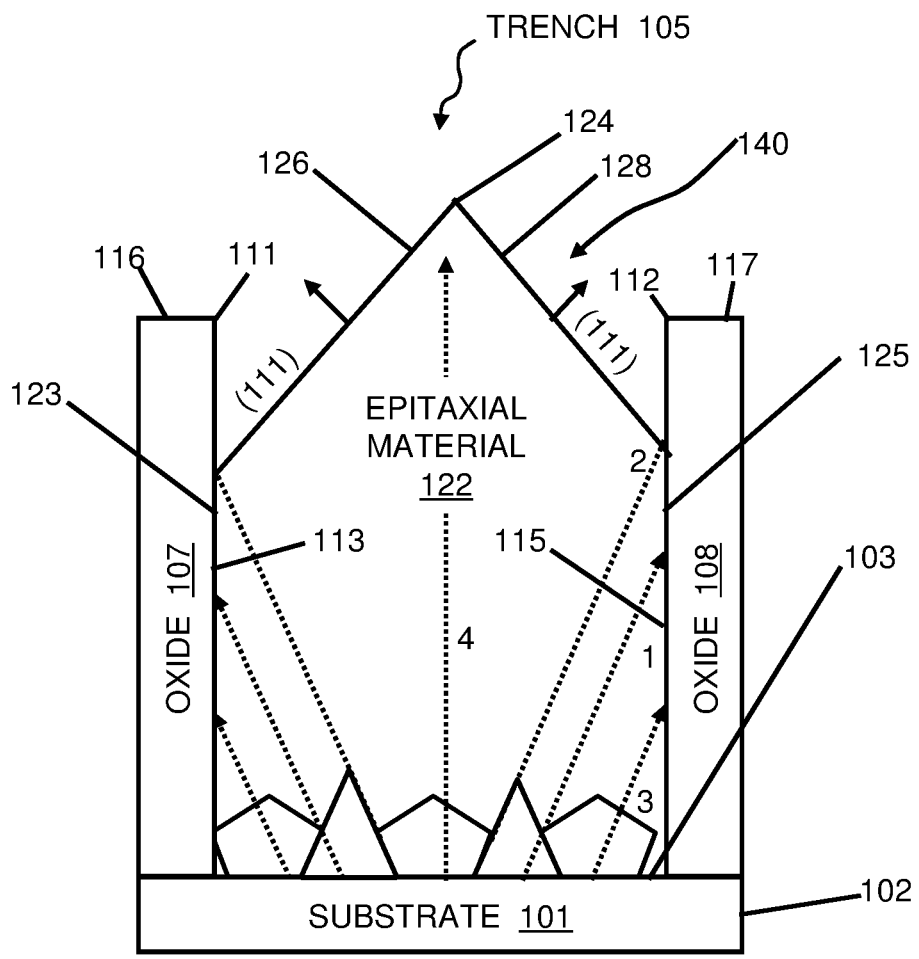
FIG. 1 is a schematic cross section view of a portion of a semiconductor substrate base after selectively, epitaxially growing a type III-V or a Germanium (Ge) material on a top surface of a substrate material in a trench beween shallow trench isolation (STI) regions.

FIG. 1 is a schematic cross section view of a portion of a semiconductor substrate base 101 after selectively, epitaxially growing a type III-V or a Germanium (Ge) material 122 on top surface 103 of substrate material 102 in trench 105 between shallow trench isolation (STI) regions 107 and 108. FIG. 1 shows semiconductor substrate or base 101 of material 102 having top surface 103. Substrate 101 may include, be formed from, deposited with, or grown from silicon, polycrystalline silicon, single crystal silicon, or various other suitable technologies for forming a silicon base or substrate, such as a silicon wafer. For example, according to embodiments, substrate 101 may be formed by growing a single crystal silicon substrate base material having a thickness of between 100 Angstroms and 1000 Angstroms of pure silicon. Alternately, substrate 101 may be formed by sufficient chemical vapor deposition (CVD) of various appropriate silicon or silicon alloy materials 102 to form a layer of material having a thickness between one and three micrometers in thickness, such as by CVD to form a thickness of two micrometers in thickness. It is also considered that substrate 101 may be a relaxed, non-relaxed, graded, and/or non-graded silicon alloy material 102. Material 102 may be a relaxed material (e.g., have a non-strained lattice) at surface 103. Material 102 may be a single crystal silicon material. Substrate 102 may be made of silicon and have top surface 103 with a (100) crystal oriented material (e.g., according to Miller Index). Substrate 101 may be a "miscut" substrate.

FIG. 1 also shows regions 107 and 108 of shallow trench isolation (STI) material formed or grown on top surface 103 of the substrate 101. STI material may be formed of an oxide material or a nitride material or combination thereof. The STI material may be formed of SiC material or another STI material as know in the art. The STI material may be amorphous material deposited or grown on material 102 (e.g., at surface 103). The STI material may be formed by atomic layer deposition (ALD) or chemical vapor deposition (CVD). The STI material may be deposited via Plasma Enhanced Chemical Deposition (PECVD). In some cases, any of various oxygen precursors, Silane precursors, or generic precursors can be used during a process (e.g., PECVD) to form the STI material, as know in the art. In some cases, the STI material may be formed by a process using TEOS+O2+RF at 400° C.

FIG. 1 also shows a layer of shallow trench isolation (STI) material 104 formed or grown on top surface 103 of the substrate 101. STI material 104 may be formed of an oxide or a nitride or combination thereof. STI material 104 may be formed of SiC or another material as know in the art. STI material 104 may be formed by atomic layer deposition (ALD) or chemical vapor deposition (CVD). STI material 104 is generally deposited via Plasma Enhanced Chemical Deposition (PECVD). In some cases, any of various oxygen precursors, Silane precursors, or generic precursors can be used during a process (e.g., PECVD) to form STI material 104, as know in the art. In some cases, STI material 104 may be formed by a process using TEOS+O2+RF at 400° C.°

In some cases, the bottom surface of regions 107 and 108 may have the same crystal lattice size as that of material 102 (e.g., at surface 103). The STI material may be a relaxed material (e.g., have a non-strained lattice) with respect to its interface (e.g., where it is chemically or atomically bonded to the surface below) with surface 103.

Regions 107 and 108 may have inner STI sidewalls 113 and 115 that define trench walls of trench 105 having height H1, width W1 and length L1 (not shown, but extending into the page). Trench sidewalls 113 and 115 may be vertical sidewalls that are perpendicular to (e.g., forming an angle of ninety degrees with respect to) substrate surface 103. More specifically trench 105 may be defined by or have a side at sidewall 113 of region 107; a side at sidewall 115 of region 108; a bottom at (or being) top surface 103 (having W1 and L1); a top at upper opening 140 (having W1 and L1); and top corners 111 and 112 (e.g., upper opening corners extending Length L1) adjacent to top surfaces 116 and 117 of regions 107 and 108.

Regions 107 and 108 may be formed (e.g., thus forming trench 105) by patterning and etching as known in the art. This may include forming a blanket layer of STI material on surface 103, then patterning and etching the STI material to form STI regions 107 and 108. In some cases, patterning and etching the STI material to form the STI regions includes using a resist or hard mask underneath a resist for the patterning materials. In some cases 1, 2, or 3 resist layers may be used for the patterning materials. In some cases, patterning and etching the STI material to form the STI regions includes using an O2 or O2/Ar plasma etch at pressures in the 10-100 mTorr range, and at room temperature. Such patterning and etching may also include etching an oxides including STI material, by etching with fluorocarbons (e.g., CF4 and/or C4F8), O2 and Ar, at pressures in the 10-100 mTorr range, and at room temperature.

Length L1 may be a length of between 10 and 100 nanometers (nm). In some cases L1 is approximately 25 nm. In some cases L1 is equal to (or approximately the same as) W1. In some cases L1 is greater than or less than W1. In this case, the top perspective area formed by top shape 124 (e.g., dependent or based upon W1 and L1) may be a rectangle. Optionally L1 may be equal to W1. In this case, the top perspective area formed by top shape 124 (e.g., dependent or based upon W1 and L1) may be square. In some cases, the top perspective area formed by top shape 124 is described as a "pyramidal" shape, such as having 4 angled sides that extend vertically in triangular shapes to form a point. In some cases, the top perspective area formed by top shape 124 does not have a circular or oval shape. In some cases, L1 is a width of between 50 and 250 nanometers (nm). In some cases L1 is two times the pitch of the gates of transistor devices formed in the sidewalls of the device portions, such as two times the pitch between the gates of transistor devices formed in the sidewalls of the device portions.

According to embodiments H1 of trench 105 may be larger than the L1 of the trench such that ratio H1/L1 is >=1.5. In some cases, the ratio H1/L1 is =1.5. In some cases, the ratio H1/L1 is >=2.0. In some cases, the ratio H1/L1 is =2.0. According to some embodiments, W1 may be between 10 and 15 nanometers (nm) and H1 may be 350 nanometers (nm).

Epitaxial material 122 may be a selectively grown (e.g., deposited) epitaxial layer of epitaxial material in trench 105. Material 122 may be a selectively, epitaxially grown type III-V or Germanium (Ge) material grown from or on top surface 103 of substrate material 102 in trench 105 between STI regions 107 and 108. According to some embodiments, material 122 may be formed by epitaxial growth (e.g., heteroepitaxy) using atomic layer epitaxy (ALE), chemical vapor deposition (CVD), Metal-Organic Chemical Vapour Deposition (MOCVD) or Metalorganic vapour phase epitaxy (MOVPE), and may only grow from "seed" surface 103 below the trench. In some cases, material 122 may be formed by epitaxial growth (e.g., heteroepitaxy) using molecular beam epitaxy (MBE), or migration enhanced epitaxy (MEE) and may only grow from "seed" surface 103 below the trench. Material 122 may be an epitaxially grown crystal buffer material, grown from a single crystal Silicon (Si) substrate surface 103.

Material 122 is shown having (111) crystal orientation top surfaces 126 and 127 forming top surface shape 124, "peak" or crystal growth pattern that results from selectively, epitaxially growing crystalline material 122 on or from the (100) crystal orientation surface 103.

Material 122 is also shown having (111) crystal orientation "vertical" sidewalls 123 and 125 touching (e.g., against or in direct contact with) STI "vertical" sidewalls 113 and 115. In some cases sidewalls 123 and 125 are parallel to (e.g., form an angle of zero degrees with) STI sidewalls 113 and 115. However, since material 122 is grown from the (100) crystal orientation surface 103, the growth of sidewalls 123 and 125 at the edge of material 122 occurs with a (111) crystal orientation. Thus, the crystal orientation of sidewalls 123 and 125 is not stabilized with respect to the vertical wall orientation of sidewalls 113 and 115, causing crystaline defects in material 122, including crystaline defects along sidewalls 123 and 125 (e.g., see the five sources of crystaline defects noted below). Thus, device material formed on or from material 122 may include crystal lattice defects the cause slower or decreased performance, reduced yield, and variation issues in circuit devices built on a device layer.

According to embodiments, five "sources" of defects (e.g., crystal lattice defects) may be observed to originate during such a selective epitaxial growth process. In some cases, the 5 sources mostly generate similar types of defects (threading dislocations, stacking faults, etc.) in the crystal lattice structure of the material. An example where such defects exist may include an embodiment where the growth of material 122 in trench 105 as shown in and described for FIG. 1, and where H1 is <1.5 W1, or H1 is <1.5 L1 (e.g., but otherwise using the dimensions as described above for FIG. 1), or where material 122 is not grown to height H1. A first source of defect may be referred to as "Stage II Strain Relaxation" source defects. This defect may include threading dislocations and similar sources of defects, as know in the art. A second source of defect may be described as "Stage III Island Merging" source defects. This defect may include threading dislocations and stacking faults, and similar sources of defects, as know in the art. A third source of defect may be described as "facets or roughness on silicon substrate" source defects. This source of defect may include threading dislocations and stacking faults, and the like, as known in the art. A fourth source of defect may be described as "single atomic steps on a silicon substrate" source defects.

This may include anti-phase boundaries, and the like, as known in the art. A fifth source of defect may be described as "epitaxial collision with oxide sidewalls" source defects. This source of defect may include stacking faults, micro-twins, and/or dislocation, and the like source of defects, as known in the art. Dislocations may include line defects such as having an extra half plane or missing and extra half plane of the lattice in a line of atoms. Dislocations may be a one-dimensional defect or a line defect; and may have a three-dimensional influence (e.g., strain fields) on the crystal structure. Stacking faults may include a disruption or dislocation at the edge of stacks of layers of different types of atoms as know in the art. Stacking faults may also include a disruption of the order or sequence of the layers of different types of atoms. Stacking faults may be two-dimensional or planar defects as know in the art; and may have a three-dimensional influence (e.g., strain fields) on the crystal structure. Micro-twins may include V shaped or two-dimensional faults or planar defects as know in the art; and may have a three-dimensional influence (e.g., strain fields) on the crystal structure.

According to embodiments, the first three sources of defects can be trapped or prevented by a structure or process that uses the concept of aspect ratio trapping (ART) where Height (H) of the trench (or the fin of epitaxially grown material) is larger than the width (W). In some cases, the first three sources of defects can be trapped or prevented by using a trench having an aspect ratio (height/width and height/length) greater than 1.5. However this scheme leaves large number of defects propagating towards the device layers in the long direction of the fin. According to embodiments, such defects can be avoided by traping defects along the sidewall of the STI forming the trenches (e.g., in both the W an length L directions) by making the Height (H) of the trench larger than the width (W) and length (L) of the trench such that ratios H/W>=1.5 and H/L>=1.5. This ratio may give a minimum H/W ratio limit to block many defects (e.g., sources 1-3) within a buffer layer formed within the trench. An example of this may include continuing the growth of material 122 in trench 105 as shown in and described for FIG. 1, to grow material 122 (e.g., sidewalls 123 and 125) up to or above height H1, where H1/W1>=1.5 and H1/L1>=1.5 such as described above for FIG. 1.

It is not believed that there was a previous solution to prevent the fifth source of defect that originates at the sidewall of the STI. For instance, the fifth source of sidewall defects (epitaxial growth collision with oxide side walls or trench sidewalls) may not be prevented by ART, alone. In some cases, the root cause for the fifth source of defect is mechanical obstruction of the (111) growth faces of the epitaxial material, STI oxide sub vertical sidewalls of the trench. In this case the side walls may be an amorphous material that forms a non zero angle with the (111) surface of the epitaxially grown material. In one example, this defect may be due to selective epitaxial growth of (111) type material 122 from surface 103 that touches or grows against sidewalls 113 and 115, as shown in FIG. 1.

Figure 2:
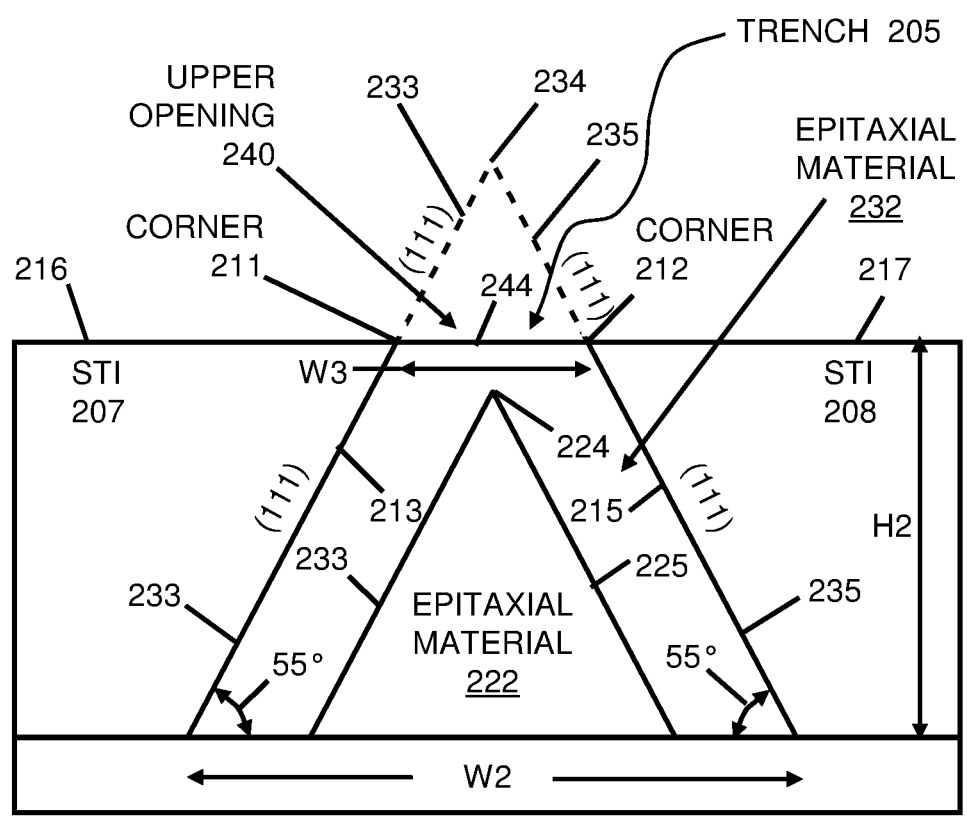
FIG. 2 is a schematic cross section view of a portion of a semiconductor substrate base after selectively, epitaxially growing a type III-V or a Germanium (Ge) material on a top surface of a substrate material in a trench having sloped sidewalls.
Figure 3:
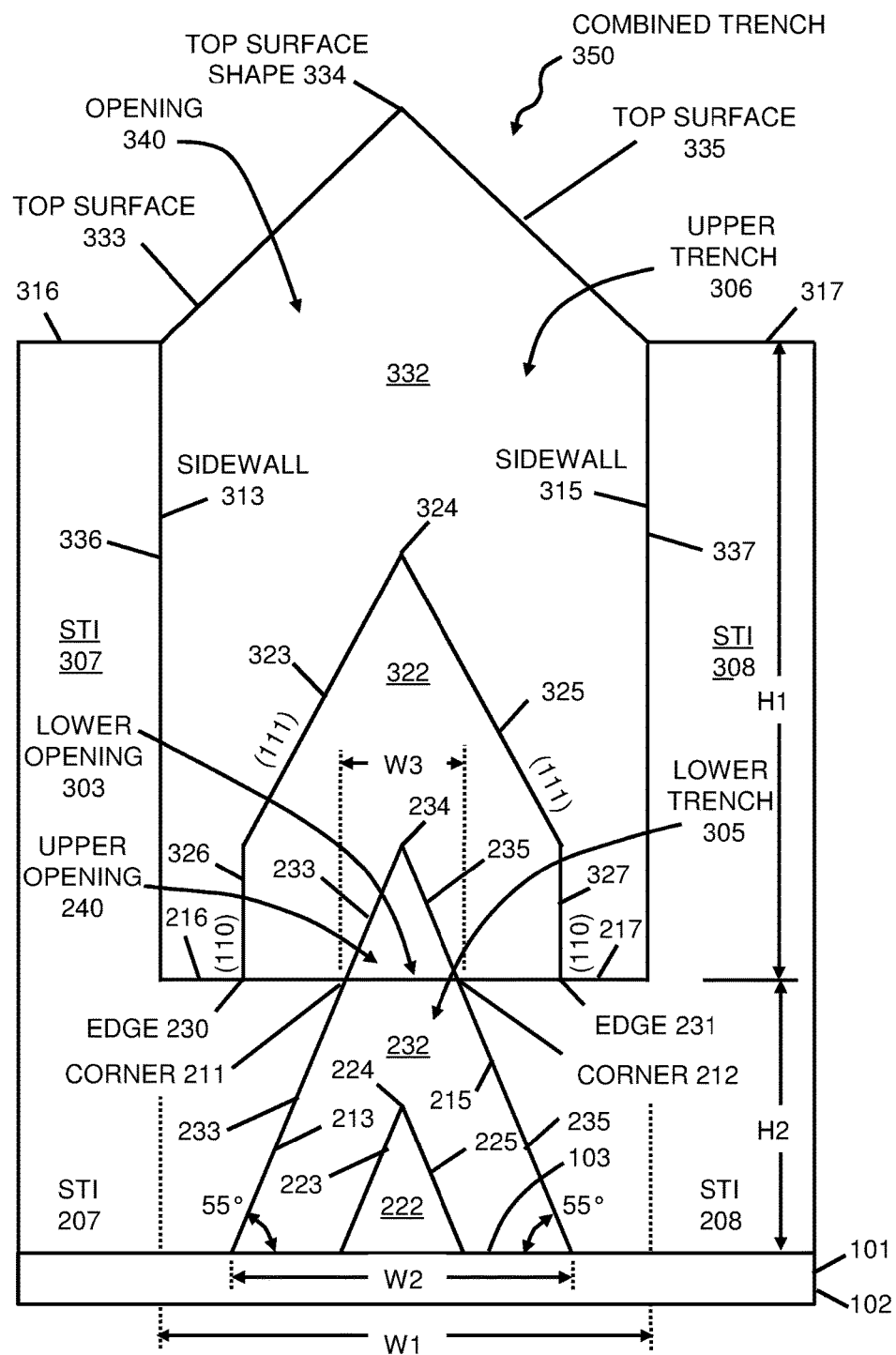
FIG. 3 is a schematic cross section view of a portion of a semiconductor substrate base after selectively, epitaxially growing a type III-V or a Germanium (Ge) material on a top surface of a substrate material in a combined trench having an upper trench over and surrounding the opening of a sloped walled lower trench.
Figure 4:
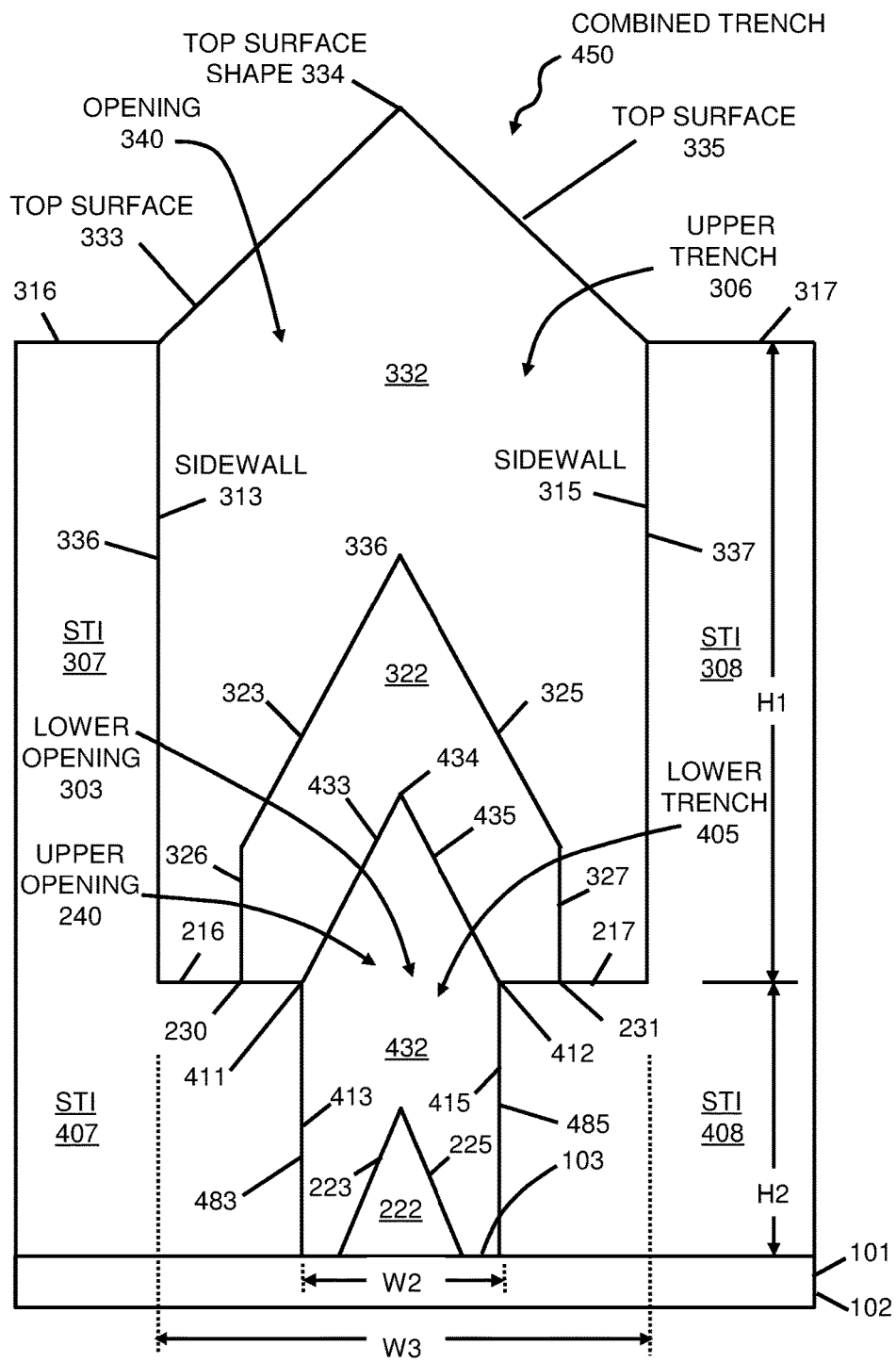
FIG. 4 is a schematic cross section view of a portion of a semiconductor substrate base after selectively, epitaxially growing a type III-V or a Germanium (Ge) material on a top surface of a substrate material in a combined trench having an upper trench over and surrounding the opening of a tall vertical walled lower trench.
Figure 5:
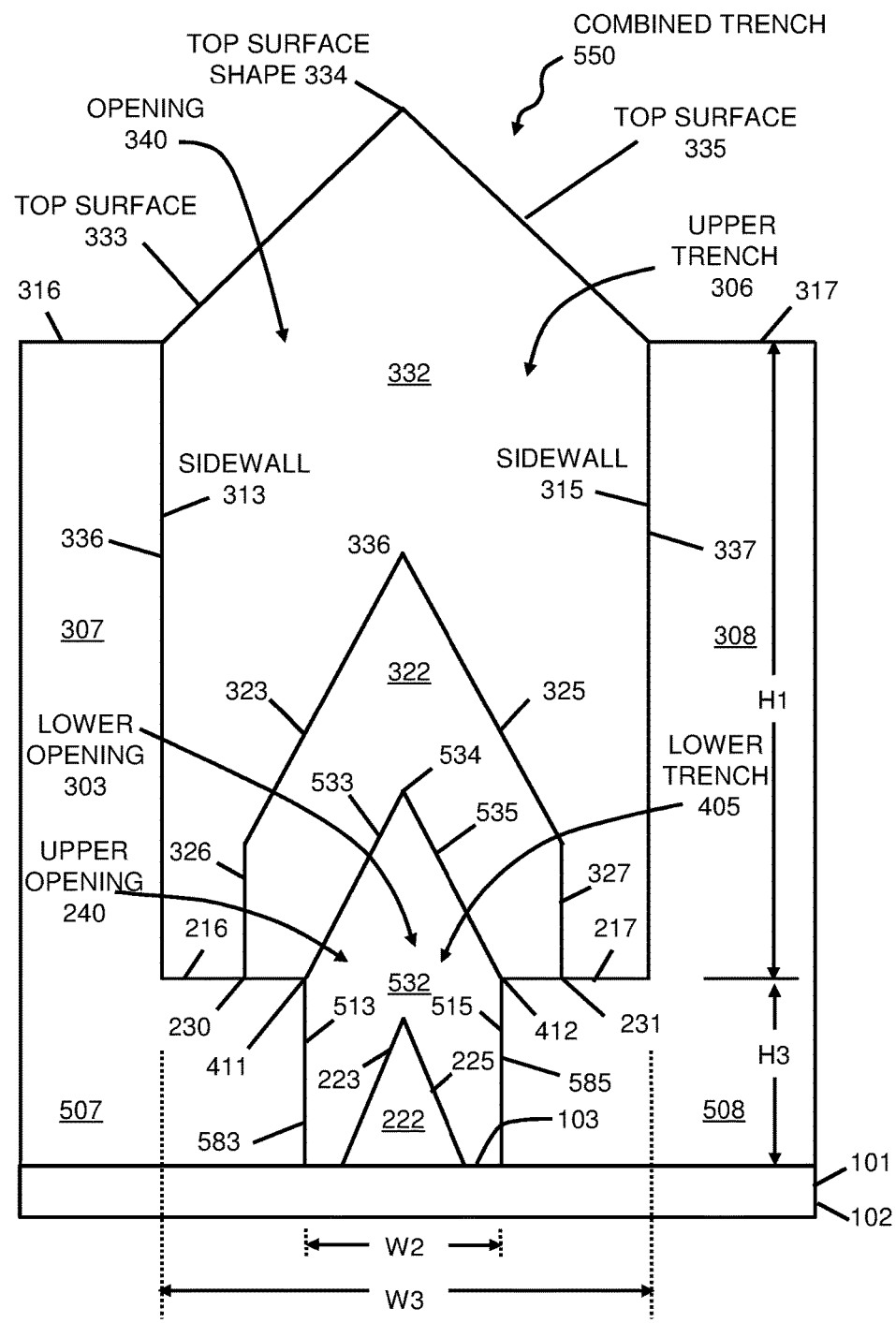
FIG. 5 is a schematic cross section view of a portion of a semiconductor substrate base after selectively, epitaxially growing a type III-V or a Germanium (Ge) material on a top surface of a substrate material in a combined trench having an upper trench over and surrounding the opening of a short vertical walled lower trench.

According to embodiments, the fifth source of sidewall defects (selective epitaxial growth collision with oxide side walls or trench sidewalls) may be prevented by selectively, epitaxially growing a type III-V or a Germanium (Ge) material (e.g., a "buffer" material) on a top surface of a substrate material (1) in a trench having sloped sidewalls, such as at an angle of between 40-70 degrees (e.g., 55°) with respect to the substrate surface (e.g., see FIGS. 2 and 3); and/or (2) in a combined trench having an upper trench over and surrounding the opening of a lower trench (e.g., the lower trench may have the sloped sidewalls, short vertical walls, or tall vertical walls) (e.g., see FIGS. 3-5). In some cases, the selective epitaxial growth is made or caused in (2) above to develop (110) crystal type sidewalls and grow laterally in the upper trench so it does approach the trench sidewall at zero degrees. Either solution may reduce or prevent the fifth source of sidewall defect, such as defects due to selective epitaxial growth of (111) type material 122 from surface 103 that touches or grows against sidewalls 113 and 115, as shown in FIG. 1 (e.g., where growth of material 122 (e.g., sidewalls 123 and 125) does not continue up to or above height H1, where H1/W1>=1.5 and H1/L1>=1.5.

In addition, if the upper trench or lower trench uses the concept of aspect ratio trapping (ART), the combined trench may also trap, reduce or prevent the first, second, and third source of defects (e.g., see FIGS. 3-5). For some embodiments, there is a distinction between how some FIG. 3 and FIG. 4 structures are going to work. For some embodiments, for FIG. 3, the bottom trench will prevent defect source #5, but will not trap all defects from sources #1-#3 (because a 55 degree sloped trench can not have an aspect ratio of 1.5 without closing off the top of the trench). So here the top trench with aspect ratio 1.5 or more may be used (e.g., is required) to trap defects from sources #1-3 that escape from the bottom trench. For some embodiments, for FIG. 4, the bottom trench will trap all defects from sources #1-3, but source #5 will get created. Here, source #5 may be blocked in the top trench.

Thus, the devices, structures and processes described herein may avoid the first, second, third and fifth source of crystaline defects noted above that are due to lattice mismatch in the layer interfaces of selective epitaxial growth. They may avoid those defects at the top surfaces of the buffer material of upon which a "device" material, layer or fin(s) may be grown. For example, crystaline defects in the trench buffer material will be prevented at a top surface of that material and, thus, not extend into or not exist in the device epitaxy regions where devices are formed (e.g., the upper device material of the regions). Thus, device fins formed or grown from the top surfaces of the buffer material may provide electronic device material (e.g., wells and channels) in which reduced defect or defect free fin based devices may be formed, thus providing faster or increased performance, increased yield, and fewer variation issues in circuit devices built on or in the device material.

FIG. 2 is a schematic cross section view of a portion of a semiconductor substrate base 101 after selectively, epitaxially growing a type III-V or a Germanium (Ge) material 222 (and 232) on top surface 103 of substrate material 102 in trench 205 between shallow trench isolation (STI) regions 207 and 208 having sloped sidewalls 213 and 215. Similar feature numbers of FIG. 2 may be the same as those described for FIG. 1. In this case, the fifth source of sidewall defects may be prevented by selectively, epitaxially growing a type III-V or a Germanium (Ge) single crystal material on a top surface of a substrate material in trench 205 having sloped sidewalls 213 and 215, such as at an angle of between 40 degrees and 70 degrees (e.g., such as 55 degrees) with respect to the substrate surface 103. The angle of 55 degrees may result from etching using an etch (e.g., a wet anisotropic etch) that removes silicon along lattice planes, thus removing the silicon along a (111) lattice plane. According to embodiments, regions 207 and 208 (e.g., trench 205) may be formed by patterning and etching. More detailed embodiments of processes for forming trench 205 and sidewalls 213 and 215 is provided below with respect to FIGS. 7A-D and 9.

This solution may reduce or prevent the fifth source of sidewall defect, such as, defects that result from selective epitaxial growth of (111) type material 122 from surface 103 that touches or grows against vertical sidewalls 113 and 115, as shown in FIG. 1. In some cases, reduce or prevent the fifth source of sidewall defect for embodiments described for FIG. 1, includes causing or making the selective epitaxial growth to develop (110) crystal type sidewalls and grow laterally in the upper trench so it does approach the trench sidewall at zero degrees.

FIG. 2 shows regions 207 and 208 of shallow trench isolation (STI) material formed or grown on top surface 103 of the substrate 101. STI material may be formed of an oxide material or a nitride material or combination thereof. The STI material may be formed of SiC material or another STI material as know in the art. The STI material may be amorphous material deposited or grown on material 102 (e.g., at surface 103), such as described above for forming STI material of regions 107 and 108.

FIG. 2 shows trench 205 defined between STI regions 207 and 208 and surface 103. In some cases, the bottom surface of regions 207 and 208 may have the same crystal lattice size as that of material 102 (e.g., at surface 103). The STI material may be a relaxed material (e.g., have a non-strained lattice) with respect to its interface (e.g., where it is chemically or atomically bonded to the surface below) with surface 103.

Regions 207 and 208 may have inner STI sidewalls 213 and 215 that define trench walls of trench 205 having height H2 (from surface 103 to top STI surfaces 216 or 217), bottom width W2 (e.g., at surface 103), bottom length L2 (not shown, but extending into the page), upper opening 240 (e.g., top) width W3, and upper opening 240 (e.g., top) length L3. In some cases, W2 and W3 can be in a range between 5 nm and <W1. In some embodiments H2 is 1.5× of W2; or in a range between 8 nm to 1.5×W1.

More specifically trench 205 may be defined by or have a side at sidewall 213 of region 207; a side at sidewall 215 of region 208; a bottom at (or being) top surface 103 (having W2 and L2); a top at upper opening 240 (having W3 and L3); and top corners 211 and 212 (e.g., upper opening corners extending Length L3) adjacent to top surfaces 216 and 217 of regions 207 and 208. Trench sidewalls 213 and 215 may be sloped or angled sidewalls that form an inward angle of between 40 degrees and 70 degrees (e.g., such as 55 degrees) (e.g., towards or into trench 205) with respect to the substrate surface 103. Thus, in some cases, width W3 may be =W2−(2*Cosine of 55 degrees*H2); or W3 may =W2−~3*H2. Length L3 may be =L2−(2*Cosine of 55 degrees*H2); or L3 may =L2−~3*H2.

In some cases L2 is equal to (or approximately the same as) W2. In this case, the top perspective area formed by W2 and L2 (and W3 and L3) forms a square. In some cases L2 is greater than or less than W2. In this case, the top perspective area formed by W2 and L2 (and W3 and L3) forms a rectangle. In some cases, the top perspective area formed by W2 and L2 (and W3 and L3) does not have a top perspective circular or oval shape.

Top surface pyramidal shape 234 may extend through trench 205 upper opening 240 having width W3 and length L3. Opening 240 may have a top perspective square or rectangular shape having W3 and a length L3 proportional to or based on width W2 and Length L2 at the bottom surface (e.g., exposed surface 103) of trench 205, respectively. In some cases, opening 240 does not have a top perspective circular or oval shape. In some cases, opening 240 is described as having top corners 211 and 212.

In some cases W2 less than or equal to W1. In some cases W2 is 40, 50, 60 or 75 percent of W1. The same relationship may exist between L2 and L1. In some cases W3 is between 3 and 20 nm. In some cases W3 is between 5 and 7 nm. In some cases W3 is 20 nm.

Epitaxial material 222 may be a selectively grown (e.g., deposited) epitaxial layer of epitaxial material in trench 205. Material 222 may be a selectively, epitaxially grown type III-V or Germanium (Ge) material grown from or on top surface 103 of substrate material 102 in trench 205 between STI regions 207 and 208. Material 222 may be epitaxially grown from the crystal surface of substrate surface 103. According to some embodiments, material 222 may be formed by epitaxial growth (e.g., heteroepitaxy) using atomic layer epitaxy (ALE), chemical vapor deposition (CVD), Metal-Organic Chemical Vapour Deposition (MOCVD) or Metalorganic vapour phase epitaxy (MOVPE), and may only grow from "seed" surface 103 below the trench. In some cases, material 222 may be formed by epitaxial growth (e.g., heteroepitaxy) using molecular beam epitaxy (MBE), or migration enhanced epitaxy (MEE) and may only grow from "seed" surface 103 below the trench. Material 222 may be an epitaxially grown crystal buffer material, grown from a single crystal Silicon (Si) substrate surface 103.

In some cases, the choice of (e.g., predetermined) growth conditions for material 222 like growth temperature, pressure of gas flux, etc may define the selectivity of the epitaxial growth. In some cases, the growth of material 222 is grown selectively from surface 103 by choosing or using a predetermined growth temperature range, pressure of gas flux range, etc., as known for material 222 to grow from material of surface 103, but not grow from or initiate on material of the STI sidewalls or top surfaces of regions 207 and 208.

According to embodiments, since material 222 is grown from the (100) crystal orientation surface 103, the growth of material 222 begins with a top surface pyramidal shape 224 having top surfaces 223 and 225 at the edge of material 222 with a (111) crystal orientation. In some cases, top surface pyramidal shape 224 may be replaced with growth forming a top surface flat top or other higher angle planes than (111), such as (311) or even (911) planes. In some cases the choice of (e.g., predetermined) growth conditions for material 222 like growth temperature, pressure of gas flux, etc may define or determine the top surface shape.

In some cases, the choice of (e.g., predetermined) growth conditions for top surfaces 223 and 225 of material 222 is selected or predetermined to tune the process conditions to grow only the (111) planes for top surfaces 223 and 225, and nothing else (e.g., excluding flat or other angle planes). However, in other cases, the choice of (e.g., predetermined) growth conditions for top surfaces 223 and 225 of material 222 is selected to include or grow flat or other higher angle planes than (111), such as (311) or even (911) planes.

According to embodiments, since material 222 is grown from the (100) crystal orientation surface 103, the growth of material 222 continues (e.g., during the same growth process or procedure, as material 232) with a top surface pyramidal shape 234 having top surfaces 233 and 235 at the edge of material 222 (e.g., material 232) with a (111) crystal orientation. In some cases, top surface pyramidal shape 234 may be replaced with growth forming a top surface flat top or other higher angle planes as noted above for shape 224, such as based on the choice of (e.g., predetermined) growth conditions for material 222. Material 232 is shown with top surface pyramidal shape 234 having (111) crystal orientation top surfaces 233 and 235 forming a "peak" or crystal growth pattern above top surfaces 216 and 217 of regions 207 and 208, such as resulting from selectively, epitaxially growing crystaline material 222 on or from the (100) crystal orientation surface 103.

In some cases material 232 is the same material as material 222. In some cases material 232 is the same material grown during the same growth process as material 222. In some cases material 232 is material 222 as material 222 continues to grown during a single growth process. Material 222 and 232 may be a "buffer" material as know in the art, such as a material to provide a surface upon which to epitaxially grow a device layer or material (e.g., for forming electronic or transistor devices, channels, diffusion layers, gates, etc . . . )

Material 232 is shown having (111) crystal orientation top surfaces 233 and 235 touching (e.g., impinging upon, disposed against or in direct contact with) STI sidewalls 213 and 215. The (111) crystal orientation of top surfaces 233 and 235 may cause the shape or angle of their surface (e.g., their planar surface) to not be constrained or changed by the material of sidewalls 213 and 215. In some cases sidewalls 233 and 235 are parallel to (e.g., form an angle of zero degrees with) STI sidewalls 213 and 215. In some cases, top surfaces 233 and 235 may be described as "sidewalls" since they are touching (e.g., against or in direct contact with) STI sidewalls 213 and 215.

The (111) crystal orientation of sidewalls 233 and 235 may be stabilized with respect to the between 40 and 70 degree (e.g., such as 55 degree) sloped vertical wall orientation of sidewalls 213 and 215, preventing or avoiding crystaline defects in material 232, including the fifth source of crystaline defects along sidewalls 123 and 125. For example, trench sidewalls 213 and 215 may form an inward angle of between 40 degrees and 70 degrees (e.g., such as 55 degrees) (e.g., towards or into trench 205) with respect to the substrate surface 103. In some cases, trench sidewalls 213 and 215 may be sloped or angled sidewalls having a slope (e.g., planar surface) that is parallel to or forms an angle of zero degrees with sidewalls (e.g., (111) crystal planar surface) of epitaxially grown layer of crystal epitaxial material 232 grown from or on (100) crystal oriented substrate surface 103 in trench 205. In some cases, the epitaxial material has (111) crystal oriented epitaxial material sidewalls 233 and 235 touching (e.g., against or in direct contact with) STI sidewalls 213 and 215. In some cases sidewalls 233 and 235 are parallel to (e.g., form an angle of zero degrees with) STI sidewalls 213 and 215.

In some cases, the (111) crystal orientation of sidewalls 233 and 235 being stabilized with respect to sidewalls 213 and 215, prevents or avoids the fifth source of sidewall defects because: (1) the epitaxial growth does not collide with oxide trench sidewalls; (2) there is no mechanical obstruction of the (111) growth faces of the epitaxial material, STI oxide sub vertical sidewalls of the trench; or (3) the trench side walls of amorphous material do not form a non zero angle with the (111) surface of the epitaxially grown material.

For example, the fifth source of crystaline defects in the trench buffer material may not extend into or not exist in the device epitaxy regions or material where devices are formed (e.g., the upper device material above material 232). Thus, device fins formed or grown from the top surfaces of the buffer material may provide electronic device material (e.g., wells and channels) in which reduced defect or defect free fin based devices may be formed, thus providing faster or increased performance, increased yield, and fewer variation issues in circuit devices built on or in the device material.

In some cases, material 222 or 232 is an epitaxial growth of buffer material that provides a defect source five free crystalline material or surface upon which to grow a defect free device material or layer. The defect free surface may be surface 244 parallel and in planar alignment with top surfaces 216 and 217. In some cases, the defect free surface is surface 244 formed after planarizing material 222, and upon which to grow a defect free device material or layer. In some cases, the defect free surface is surfaces 233 and 235 extending above surface 244 (e.g., forming top 234), and upon which to grow a defect free device material or layer.

In some embodiments, a device layer of device crystal epitaxial material may be epitaxially grown on the top surface of the buffer material (e.g., material 232) and lateral growth over a top surface 216 and 217 of the first and second STI regions. The lateral growth may create vertical sidewalls of material 232 having (110) crystal orientation (e.g., see FIG. 3-5). Devices or device fins may be formed from the device layer, fins, or fin sidewalls grown from or on material 222 or surface 233.

FIG. 3 is a schematic cross section view of a portion of a semiconductor substrate base 101 after selectively, epitaxially growing a type III-V or a Germanium (Ge) material on top surface 103 of substrate material 102 in a combined trench 350 having an upper trench 306 having a lower surface above, open to, and surrounding the upper opening of a sloped walled lower trench 305. Similar feature numbers of FIG. 3 may be the same as those described for FIGS. 1-2.

In this case, the first, second, third and fifth source of sidewall defects may be prevented by selectively, epitaxially growing a type III-V or a Germanium (Ge) single crystal material on a top surface of a substrate material in combined trench 350 having upper trench 306 over and surrounding opening 240 of lower trench 305. Specifically, the fifth source of defect may be prevented by having lower trench 305 having the sloped sidewalls at an angle of between 40 degrees and 70 degrees (e.g., such as 55 degrees) with respect to the substrate surface (e.g., see FIG. 2 trench 205); or by using a combined trench concept where upper trench 306 has an upper trench lower surface 216 and 217 above, open to, and completely surrounding the lower trench upper opening 240. The first, second, third source of sidewall defects may be prevented by having the upper trench 306 that use the concept of aspect ratio trapping (ART), such as by having a trench height at least 1.5 times its width and at least 1.5 times its length.

FIG. 3 shows combined trench 350 having an upper trench 306 formed between STI regions 307 and 308 and having lower surface (e.g., surfaces 216 and 217 and opening 303) above, open to and surrounding upper opening 240 of sloped walled lower trench 305. In some cases, the lower surface has a width and a length that are greater than a width and a length of opening 240. Upper trench 306 may have lower opening 303 equal to upper opening 240 of lower trench 305 (e.g., both openings having width W3 and length L3). In some cases, opening 303 may be described as the same opening as opening 240. According to some embodiments, the openings have the same axis or center (e.g., are horizontally centered over each other with respect to Width and Length).

For lower trench 305, FIG. 3 shows a schematic cross section view of a portion of a semiconductor substrate base 101 after selectively, epitaxially growing a type III-V or a Germanium (Ge) material 222 (and 232) on top surface 103 of substrate material 102 in trench 305 between shallow trench isolation (STI) regions 207 and 208 having sloped sidewalls 213 and 215. Lower trench 305 may be similar to trench 205 of FIG. 2. In some cases, growing material 222 (and 232) on top surface 103 of substrate material 102 in trench 305 of FIG. 3 may be similar to the descriptions above for growing material 222 (and 232) on top surface 103 of substrate material 102 in trench 205 in FIG. 2. In this case, the fifth source of defect may be prevented by having lower trench 305 having the sloped sidewalls at an angle of between 40 degrees and 70 degrees (e.g., such as 55 degrees) with respect to the substrate surface (e.g., see FIG. 2 description).

For upper trench 306, FIG. 3 shows a schematic cross section view of a portion of a semiconductor substrate base 101 after selectively, epitaxially growing a type III-V or a Germanium (Ge) material 322 (and 332) from one or more top surfaces of material 232 (or 222, which is grown from surface 103) in trench 306, and onto top surfaces 216 and 217 of STI regions 207 and 208; and grown between STI regions 307 and 308 having vertical sidewalls 313 and 315. Features 307, 308, 313, 315, 316 and 317 of upper trench 306 may be similar to features 107, 108, 113, 115, 116 and 117 of trench 105 of FIG. 1, respectively, with the exception of how they are formed, and any other exceptions noted below.

FIG. 3 shows upper trench STI regions 307 and 308 of STI material formed or grown on top surfaces 216 and 217 of STI regions 207 and 208, respectively. STI material of STI regions 307 and 308 may be formed of a same material as regions 107 and 108. STI material of STI regions 307 and 308 may have a same strain characteristics with respect to top surfaces 216 and 217, as regions 107 and 108 have with respect to top surface 103.

Regions 307 and 308 may have inner STI sidewalls 313 and 315 that define trench walls of trench 306 having height H1 (from surface 216 or 217 to top STI surfaces 316 or 317), bottom width W1 (e.g., across surfaces 216 or 217, and opening 303), bottom length L1 (not shown, but extending into the page), upper opening 340 (e.g., top) width W1, and upper opening 340 length L1. More specifically trench 306 may be defined by or have a side at sidewall 313 of region 307; a side at sidewall 315 of region 308; bottom surfaces 216 and 217, and bottom opening 303; and top surfaces 316 and 317 of regions 307 and 308. Sidewalls 313 and 315 may be vertical sidewalls that are perpendicular to (e.g., forming an angle of ninety degrees with respect to) surfaces 216 and 217.

According to embodiments, regions 307 and 308 (e.g., trench 306) may be formed by patterning and etching. More detailed embodiments of processes for forming trenches 305, 306 and 350 and their sidewalls are provided below with respect to FIGS. 7A-I and 9.

Growing material 322 (and 332) from one or more top surfaces (e.g., 233 and 235, or a planar surface of material 232 adjacent to surfaces 216 and 217, see 244 of FIG. 2) of material 232 (or 222, which is grown from surface 103) into trench 306 of FIG. 3 may be different than the descriptions above for growing material 122 on top surface 103 of substrate material 102 in trench 105 in FIG. 1, because material 322 may be a grown over but not from amorphous top surfaces 216 and 217 of STI regions 207 and 208.

Epitaxial material 322 may be a selectively grown (e.g., deposited) epitaxial layer of epitaxial material in trench 306 that is grown from top surfaces 233 and 235 (or a planar surface of material 232 adjacent to surfaces 216 and 217, see 244 of FIG. 2) of material 232 (or 222, which is grown from surface 103) in trench 306, and over amorphous top surfaces 216 and 217 of STI regions 207 and 208, between vertical sidewalls 313 and 315. Material 322 may be a selectively, epitaxially grown type III-V or Germanium (Ge) material grown from or on a top surface of material 232 extending into trench 306 between STI regions 307 and 308. According to some embodiments, material 322 may be formed by epitaxial growth (e.g., heteroepitaxy) using atomic layer epitaxy (ALE), chemical vapor deposition (CVD), Metal-Organic Chemical Vapour Deposition (MOCVD) or Metalorganic vapour phase epitaxy (MOVPE), and may only grow from "seed" surface 103 below trench 305. In some cases, material 322 may be formed by epitaxial growth (e.g., heteroepitaxy) using molecular beam epitaxy (MBE), or migration enhanced epitaxy (MEE) and may only grow from "seed" surface 103 below trench 305. Material 322 may be an epitaxially grown crystal buffer material, grown from a single crystal Silicon (Si) substrate surface 103, which is initially grown as material 222, then 232, then 322 during the same growth process or processing period or "step".

Material 322 may grow differently than material 222 or 232, due to growth of material 322 over but not from amorphous top surfaces 216 and 217, as compared to growing material 222 and 232 from crystal top surface 103. Because material 322 is grown from one or more top surfaces (e.g., 233 and 235, or a planar surface of material 232 adjacent to surfaces 216 and 217, see 244 of FIG. 2) of material 322 (or 222, which are both grown from crystal seed layer or surface 103 of material 102), but material 322 is not grown from amorphous top surfaces 216 and 217 of STI regions 507 and 508. Because of this, in some cases, material 322 forms: (1) vertical (110) crystal oriented sidewalls 326 and 327 along the top of surfaces 216 and 217; as well as (2) top surfaces 323 and 325 above sidewalls 326 and 327 with a (111) crystal orientation. In some cases, the vertical growth rate of material 322 (e.g., growth of top surface shape 324 in direction H1) is greater than the horizontal rate (e.g., growth of sidewall 326 plus 327 in direction W1).

In this case, the fifth source of defect may be prevented by using combined trench 350 with upper trench 306 having upper trench lower STI surfaces 216 and 217 above, open at lower opening 303 to, and completely surrounding lower trench 305 upper opening 240, because material 322 (e.g., and 332) is grown from crystal seed layer or surface 103, but is not grown from amorphous top surfaces 216 and 217. Because of this, material 322 forms vertical (110) crystal oriented sidewalls 336 and 337 that touch or grow against sidewalls 313 and 315 as described further below. In some cases, upper trench 306 having lower surfaces completely surrounding lower trench 305 upper opening 240 includes STI surfaces 216 and 217 extending outward from opening 240 in all directions (e.g., 360 degrees with respect to an axis pointing straight up through opening 240) along the bottom surface of trench 306. In some cases, completely surrounding lower trench 305 upper opening 240 includes opening 240 being an island in the middle of STI surfaces 216 and 217. In some cases, completely surrounding lower trench 305 upper opening 240 includes STI surfaces 216 and 217 forming a square or rectangular perimeter around opening 240 (e.g., viewed from above trench 306).

In some cases, the choice of (e.g., predetermined) growth conditions for material 322 are similar to those for material 222. In some cases, the growth of material 322 is grown selectively from a top surface of material 232 by choosing or using a predetermined growth temperature range, pressure of gas flux range, etc., as known for material 322 to grow from material 232, but not grow from or initiate on material of the STI top surfaces 216 and 217, or STI sidewalls 313 and 315 of regions 207 and 208. In some cases, growth 322 in top trench 206 has the same crystal orientation as base substrate material 102, such as having (100) or (001) crystal orientation perpendicular to substrate, which is the same as the orientation of material 102.

According to embodiments, since material 322 has a crystal orientation grown from the (100) crystal orientation surface 103, the growth of material 322 continues with the same crystal orientation as that of material 102. More specifically, in some cases, material 322 has a crystal orientation grown of (111) as it grows vertically to form top surfaces 323 and 325. This may be similar to descriptions for growing top surfaces 233 and 235 (e.g., grow from or on top surfaces 223 and 225).

According to embodiments, since material 322 has a crystal orientation grown from the (100) crystal orientation surface 103, the growth of material 322, from surfaces of material 232, forms a top surface pyrimidal shape 324 having top surfaces 323 and 325 at the top of material 322 with a (111) crystal orientation. In some cases, top surface pyramidal shape 324 may be replaced with growth forming a top surface flat top or other higher angle planes than (111), such as (311) or even (911) planes. In some cases the choice of (e.g., predetermined) growth conditions for material 322 like growth temperature, pressure of gas flux, etc may define or determine the top surface shape. In some cases the choice of (e.g., predetermined) growth conditions for material 322 like growth temperature, pressure of gas flux, etc may define or determine the top surfaces 323 and 325 growth rate or speed.

In some cases, the choice of (e.g., predetermined) growth conditions for top surfaces 323 and 325 of material 322 is selected or predetermined to tune the process conditions to grow only the (111) planes for top surfaces 323 and 325, and nothing else (e.g., excluding flat or other angle planes). However, in other cases, the choice of (e.g., predetermined) growth conditions for top surfaces 323 and 325 of material 322 is selected to include or grow flat or other higher angle planes than (111), such as (311) or even (911) planes.

According to embodiments, since material 322 grows from material 232 (e.g., surfaces 233 and 235, or a planar surface of material 232 adjacent to surfaces 216 and 217, see 244 of FIG. 2) over or touching amorphous top surfaces 216 and 217 of STI regions 207 and 208, material 322 forms vertical (110) crystal oriented sidewalls 326 and 327 along the top of surfaces 216 and 217. More specifically, in some cases, as material 322 grows along edges 230 and 231, it grows with or has a (110) crystal orientation as it grows to form vertical sidewalls 326 and 327. This (110) crystal orientation may be different than the (111) crystal orientation sidewalls 123 and 125 of FIG. 1; and may be different than the (111) sidewalls 223 and 225 of FIG. 2. In some cases, the choice of (e.g., predetermined) growth conditions for sidewalls 326 and 327 of material 322 is selected or predetermined to tune the process conditions to grow only the (110) planes for sidewalls 326 and 327, and nothing else (e.g., excluding (110) or other angle planes).

According to embodiments, as the (110) sidewalls 326 and 327 of material 322 grow across or along the top of surfaces 216 and 217 towards walls 313 and 315 (e.g., in direction W1 and L1), the top surfaces 323 and 325 grow from the top, or above sidewalls 326 and 327, towards opening 340 (e.g., in direction H1). In some cases the choice of (e.g., predetermined) growth conditions for material 322 like growth temperature, pressure of gas flux, etc may define or determine the sidewalls 326 and 327 growth rate or speed. In some cases, the vertical growth rate of top surfaces 323 and 325 (e.g., in direction H1) is greater than the horizontal growth rate of sidewalls 326 and 327 (e.g., in direction W1). In some cases the vertical rate is at least three time as fast as the horizontal rate. According to embodiments, the growth of material 322 continues (e.g., during the same growth process or procedure, as material 332) with: (1) vertical (110) crystal oriented sidewalls 336 and 337 along the top of surfaces 216 and 217; as well (2) top surfaces 333 and 335 above sidewalls 336 and 337 with a (111) crystal orientation, and forming top surface pyramidal shape 334.

In some cases, top surface pyramidal shape 334 may be replaced with growth forming a top surface flat top or other higher angle planes as noted above for shape 324, such as based on the choice of (e.g., predetermined) growth conditions for material 322. Material 332 is shown with top surface pyramidal shape 334 having (111) crystal orientation top surfaces 333 and 335 forming a "peak" or crystal growth pattern above top surfaces 316 and 317 of regions 307 and 308, such as resulting from selectively, epitaxially growing crystaline material 322 on or from material 232.

In some cases material 332 is the same material as material 322. In some cases material 332 is the same material grown during the same growth process as material 322. In some cases material 332 is material 322 as material 322 continues to grown during a single growth process. In some cases, the choice of (e.g., predetermined) growth conditions for material 332 are similar to those for material 222 or material 322. Material 322 and 332 may be a "buffer" material as know in the art, such as a material to provide a surface upon which to epitaxially grow a device layer or material (e.g., for forming electronic or transistor devices, channels, diffusion layers, gates, etc . . . ).

In some cases, because material 332 is grown from one or more top surfaces (e.g., 323 and 325) and one or more sidewalls (e.g., 326 and 327) of material 322 (which are both grown from crystal seed layer or surface 103 of material 102), but material 322 is not grown from amorphous top surfaces 216 and 217 of STI regions 207 and 208. Because of this, in some cases, material 332 continues to form: (1) vertical (110) crystal oriented sidewalls 336 and 337 along the top of surfaces 216 and 217; as well as (2) top surfaces 333 and 335 above sidewalls 336 and 337 with a (111) crystal orientation. In some cases, the vertical growth rate of material 332 continues to be greater than the horizontal rate.

According to embodiments, growth of material 332 continues with the same crystal orientation as that of material 102. In some cases, material 332 has a crystal orientation grown of (111) as it grows vertically to form top surfaces 333 and 335. This may be similar to descriptions for growing top surfaces 323 and 325 (e.g., grow from or on top surfaces 233 and 235).

According to embodiments, the growth of material 332, from surfaces of material 322, forms a top surface pyrimidal shape 334 having top surfaces 333 and 335 at the top of material 332 with a (111) crystal orientation, such as described for top surface pyrimidal shape 324 having top surfaces 323 and 325 at the top of material 322. Top surface pyramidal shape 334 may extend through trench 306 upper opening 340. In some cases, opening 340 does not have a top perspective circular or oval shape. In some cases, opening 340 is described as having top corners similar to corners 111 and 112.

In some cases the choice of (e.g., predetermined) growth conditions for material 332 like growth temperature, pressure of gas flux, etc may define or determine the sidewalls 336 and 337 growth rate or speed similar to that described for growing sidewalls 326 and 327 from material 322. In some cases, this causes the growth of sidewalls 336 and 337 to reach surfaces 312 and 315; prior to top surfaces 323 and 325 reaching surface 316 and 317 (e.g., a corner of surface 316 and 317). Material 332 of sidewalls 336 and 337 having (110) crystal orientation may be touching (e.g., against or in direct contact with) STI sidewalls 313 and 315. In some cases sidewalls 336 and 337 are parallel to (e.g., form an angle of zero degrees with) STI sidewalls 313 and 315.

In some cases combined trench 350 or the desciptions above for FIG. 3 reduce or prevent the first, second, third and fifth source of sidewall defects by selectively, epitaxially growing a type III-V or a Germanium (Ge) single crystal material on a top surface 103 of a substrate material in combined trench 350 having upper trench 306 over and surrounding opening 240 of lower trench 305 having the sloped sidewalls 213 and 215 at an angle of between 40 degrees and 70 degrees (e.g., such as 55 degrees) with respect to the substrate surface 103. In this case, the fifth source of defect may be prevented by having the lower trench having the sloped sidewalls at an angle of between 40 degrees and 70 degrees (e.g., such as 55 degrees) with respect to the substrate surface (e.g., see FIG. 2 description); or by using combined trench 350 with upper trench 306 having upper trench lower STI surfaces 216 and 217 above, open at lower opening 303 to, and completely surrounding lower trench 305 upper opening 240. The first, second, third source of sidewall defects may be prevented by having upper trench 306 with height H1 at least 1.5 times width W1 and at least 1.5 times length L1 to provide aspect ratio trapping (ART), such as noted above for FIG. 1, where material 122 is grown to height H1.

For example, the first, second, third and fifth source of defect may not have extended into or not exist in the epitaxy regions or material where devices are formed (e.g., the upper device material above material 332). Thus, device fins formed or grown from the top surfaces of the buffer material may provide electronic device material (e.g., wells and channels) in which reduced defect or defect free fin based devices may be formed, thus providing faster or increased performance, increased yield, and fewer variation issues in circuit devices built on or in the device material.

FIG. 4 is a schematic cross section view of a portion of a semiconductor substrate base 101 after selectively, epitaxially growing a type III-V or a Germanium (Ge) material on a top surface 103 of substrate material 102 in a combined trench 450 having an upper trench 306 having a lower surface above, open to, and surrounding the upper opening of a tall vertical walled lower trench 405. Similar feature numbers of FIG. 4 may be the same as those described for FIGS. 1-3. However, there may be some exceptions or differences as explained below.

In this case, the first, second, third and fifth source of sidewall defects may be prevented by selectively, epitaxially growing a type III-V or a Germanium (Ge) single crystal material on a top surface of a substrate material in combined trench 450 having an upper trench 306 over and surrounding opening 240 of "tall" lower trench 408. Specifically, the fifth source of defect may be prevented by using a combined trench concept where the upper trench 306 has an upper trench lower surface 216 and 217 above, open to, and completely surrounding the lower trench upper opening 240. The first, second, third source of sidewall defects may be prevented by having the upper trench 306, or "tall" lower trench 405 use the concept of aspect ratio trapping (ART), such as by having a trench height at least 1.5 times its width and at least 1.5 times its length.

FIG. 4 shows combined trench 450 having an upper trench 306 formed between STI regions 307 and 308 and having lower surface (e.g., surfaces 216 and 217 and opening 303) above, open to and surrounding upper opening 240 of tall vertical walled lower trench 405. Upper trench 306 may have lower opening 303 equal to or the same opening as upper opening 240 of lower trench 405 (e.g., both openings having width W3 and length L3). According to some embodiments, the openings have the same axis or center (e.g., are horizontally centered over each other with respect to Width and Length).

For lower trench 405, FIG. 4 shows a schematic cross section view of a portion of a semiconductor substrate base 101 after selectively, epitaxially growing a type III-V or a Germanium (Ge) material 222 (and 432) on top surface 103 of substrate material 102 in trench 405 between shallow trench isolation (STI) regions 407 and 408 having tall vertical sidewalls 413 and 415. Lower trench 405 may be similar to trench 105 of FIG. 1, but have height H2, width W3 and length L3. In some cases, growing material 222 (and 432) on top surface 103 in trench 405 of FIG. 4 may be similar to the descriptions above for growing material 122 on top surface 103 of substrate material 102 in trench 105 in FIG. 1. Consequently, in some cases, trench 405 may be a smaller version of trench 105 (e.g., with any exceptions noted herein).

According to some embodiments, features 407, 408, 413, 415, 483, 485, 432, 433, 434 and 435 of lower trench 405 may be similar to features 107, 108, 113, 115, 123, 125, 122 (similar to 432), 126, 124 and 128 of trench 105 of FIG. 1, respectively, with the exception of (1) having height H2, width W3 and length L3 (e.g., as compared to height H1, width W1 and length L1 of trench 105); and any other exceptions noted below.

According to some embodiments, corners 411 and 412 of lower trench 405 may be similar to corners 211 and 212 of FIG. 3, respectively, with the exception that each of corners 411 and 412 form an angle of 90 degrees between a sidewall of trench 405 and top surfaces 216 and 217, while each of corners 211 and 212 form an angle of between 40 degrees and 70 degrees (e.g., such as 55 degrees) between the sidewalls and surfaces. More specifically trench 405 may be defined by or have a side at sidewall 413 of region 407; a side at sidewall 415 of region 408; a bottom at (or being) top surface 103 (having W3 and L3); a top at upper opening 240 (having W3 and L3); and top corners 411 and 412 (e.g., upper opening corners extending Length L3) adjacent to top surfaces 216 and 217 of regions 407 and 408. Trench sidewalls 413 and 415 may be tall vertical (e.g., form a right angle with surface 103) with respect to the substrate surface 103. Material 432 may have (111) crystal orientation "vertical" sidewalls 483 and 485 touching (e.g., against or in direct contact with) STI "vertical" sidewalls 413 and 415, similar to descriptions above for sidewalls 123 and 125 touching (e.g., against or in direct contact with) STI "vertical" sidewalls 113 and 115 of FIG. 1.

H2 of trench 405 may be larger than the W3 of the trench such that ratio H2/W3 is >=1.5. In some cases, the ratio H2/W3 is =1.5. In some cases, the ratio H2/W3 is >=2.0. In some cases, the ratio H2/W3 is =2.0. According to some embodiments, W3 may be between 10 and 15 nanometers (nm) and H1 may be 350 nanometers (nm). H2 of trench 405 may be larger than the L3 of the trench such that ratio H2/L3 is >=1.5. In some cases, the ratio H2/L3 is =1.5. In some cases, the ratio H2/L3 is >=2.0. In some cases, the ratio H2/L3 is =2.0. According to some embodiments, L3 may be between 10 and 15 nanometers (nm) and H1 may be 350 nanometers (nm). In some cases L3 is equal to (or approximately the same as) W3. In some cases L3 is greater than or less than W3.

FIG. 4, shows material 432 extending (e.g., growing) through opening 240, which may be similar to material 122 adjacent surfaces 126 and 128 FIG. 1. Because of this, in some cases, material 432; sidewalls 433 and 435; and top surface pyramidal shape 434, may be similar to material 122; sidewalls 126 and 128; and top surface pyramidal shape 124 of FIG. 1 (e.g., where material 122 is grown to height H1). In this case, the first, second, third source of sidewall defects may be prevented by having lower trench 405 with height H2 at least 1.5 times width W3 and at least 1.5 times length L3 to provide aspect ratio trapping (ART), such as noted above for FIG. 1 (e.g., where material 122 is grown to height H1). For example, the first, second, third source of sidewall defects may be prevented in material 432 at surfaces 433 and 435 (or a planar surface of material 432 at or adjacent surfaces 216 and 217) due to the ART of trench 405 (e.g., H2 being >=105 times W3, and H2 being >=105 times L3).

For upper trench 306, FIG. 4 shows a schematic cross section view of a portion of a semiconductor substrate base 101 after selectively, epitaxially growing a type III-V or a Germanium (Ge) material 322 (and 332) from one or more top surfaces of material 432 (or 222, which is grown from surface 103) in trench 306, and onto top surfaces 216 and 217 of STI regions 407 and 408; and grown between STI regions 307 and 308 having vertical sidewalls 313 and 315.

In some embodiments, materials 322; sidewalls 326, 327; top surfaces 323 and 325; and top surface pyramidal shape 324, may be similar in both FIGS. 3 and 4. This may be because 322 is grown from one or more top surfaces (e.g., 433 and 435, or a planar surface of material 432 adjacent to surfaces 216 and 217, e.g., see 244 of FIG. 2) of material 432 (or 222, which are both grown from crystal seed layer or surface 103 of material 102) but material 322 is not grown from amorphous top surfaces 216 and 217 of STI regions 407 and 408. Because of this, in some cases, material 322 forms: (1) vertical (110) crystal oriented sidewalls 326 and 327 along the top of surfaces 216 and 217; as well as (2) top surfaces 323 and 325 above sidewalls 326 and 327 with a (111) crystal orientation. In some cases, the vertical growth rate of material 322 (e.g., growth of top surface shape 324 in direction H1) is greater than the horizontal rate (e.g., growth of sidewall 326 plus 327 in direction W1).

According to embodiments, the growth of material 322 continues (e.g., during the same growth process or procedure) as material 332 as noted above. In some cases, because material 332 is grown from one or more top surfaces (e.g., 323 and 325) and one or more sidewalls (e.g., 326 and 327) of material 322 (which are both grown from crystal seed layer or surface 103 of material 102), but material 322 is not grown from amorphous top surfaces 216 and 217 of STI regions 207 and 208. Because of this, in some cases, material 332 continues to form: (1) vertical (110) crystal oriented sidewalls 336 and 337 along the top of surfaces 216 and 217; and forms a top surface pyrimidal shape 334 having top surfaces 333 and 335. Material 332 of sidewalls 336 and 337 having (110) crystal orientation may be touching (e.g., against or in direct contact with) STI sidewalls 313 and 315. In some cases sidewalls 336 and 337 are parallel to (e.g., form an angle of zero degrees with) STI sidewalls 313 and 315.

Growing material 322 (and 332) from one or more top surfaces (e.g., 433 and 435) of material 432 of FIG. 4 may be different than the descriptions above for growing material 122 on top surface 103 of substrate material 102 in trench 105 in FIG. 1, because material 322 may be a grown over but not from amorphous top surfaces 216 and 217 of STI regions 207 and 208. More specifically, in some cases, as material 322 grows along edges 230 and 231, it grows with or has a (110) crystal orientation as it grows to form vertical sidewalls 326 and 327 which touch sidewalls 313 and 315. Consequently, in these cases, the other features of trench 306 may be similar to trench 306 (e.g., with any exceptions noted herein).

In some cases, the fifth source of sidewall defects may not be prevented in material 432 due to trench having the sloped sidewalls at an angle of between 40 degrees and 70 degrees (e.g., such as 55 degrees) with respect to the substrate surface (e.g., see FIG. 2 description of trench 305). However, according to embodiments, the fifth source of sidewall defects may be prevented in material 432 by using combined trench 450 with upper trench 306 having upper trench lower STI surfaces 216 and 217 above, open at lower opening 503 to, and completely surrounding lower trench 405 upper opening 440.

According to embodiments, trenches 405, 306 and 450 and their sidewalls may be formed by patterning and etching. More detailed embodiments of processes for forming trenches 405, 306 and 450 and their sidewalls is provided below with respect to FIGS. 8A-I and 10.

Epitaxial material 322 may be a selectively grown (e.g., deposited) epitaxial layer of epitaxial material in trench 306 that is grown from top surfaces 433 and 435 of material 432 (or 222, which is grown from surface 103) in trench 306, and over amorphous top surfaces 216 and 217 of STI regions 207 and 208, between vertical sidewalls 313 and 315, as described above for growing material 322 from surfaces of material 232. Material 322 may be an epitaxially grown crystal buffer material, grown from a single crystal Silicon (Si) substrate surface 103, which is initially grown as material 222, then 432, then 322 during the same growth process or processing period or "step".

In some cases, the choice of (e.g., predetermined) growth conditions for material 322 are similar to those for material 222. In some cases, the growth of material 322 is grown selectively from a top surface of material 432 by choosing or using a predetermined growth temperature range, pressure of gas flux range, etc., as known for material 322 to grow from material 432, but not grow from or initiate on material of the STI top surfaces 216 and 217, or STI sidewalls 313 and 315 of regions 207 and 208.

In some cases combined trench 450 or the desciptions above for FIG. 4 reduce or prevent the first, second, third and fifth source of sidewall defects by selectively, epitaxially growing a type III-V or a Germanium (Ge) single crystal material on a top surface 103 of a substrate material in combined trench 450 having upper trench 306 over and surrounding opening 240 of lower trench 405 having "tall" vertical sidewalls 413 and 415 with respect to the substrate surface 103. In this case, the fifth source of defect may be prevented by using combined trench 450 with upper trench 306 having upper trench lower STI surfaces 216 and 217 above, open at lower opening 303 to, and completely surrounding lower trench 405 upper opening 240. The first, second, third source of sidewall defects may be prevented by (1) having upper trench 306 with height H1 at least 1.5 time width W1 and at least 1.5 time length L1 to provide aspect ratio trapping (ART), such as noted above for FIG. 1 (e.g., where material 122 is grown to height H1); or (2) having lower trench 405 with height H2 at least 1.5 time width W3 and at least 1.5 time length L3 to provide aspect ratio trapping (ART), such as noted above for FIG. 1 (e.g., where material 122 is grown to height H1).

For example, the first, second, third and fifth source of of crystaline defects in the trench buffer material may not extend into or not exist in the device epitaxy regions or material where devices are formed (e.g., the upper device material above material 332). Thus, device fins formed or grown from the top surfaces of the buffer material may provide electronic device material (e.g., wells and channels) in which reduced defect or defect free fin based devices may be formed, thus providing faster or increased performance, increased yield, and fewer variation issues in circuit devices built on or in the device material.

FIG. 5 is a schematic cross section view of a portion of a semiconductor substrate base 101 after selectively, epitaxially growing a type III-V or a Germanium (Ge) material on top surface 103 of substrate material 102 in a combined trench 550 having an upper trench 306 having a lower surface above, open to, and surrounding the upper opening of a short vertical walled lower trench 505. Similar feature numbers of FIG. 5 may be the same as those described for FIGS. 1-4. However, there may be some exceptions or differences as explained below.

In this case, the first, second, third and fifth source of sidewall defects may be prevented by selectively, epitaxially growing a type III-V or a Germanium (Ge) single crystal material on a top surface of a substrate material in combined trench 550 having upper trench 306 over and surrounding opening 240 of "short" lower trench 505 (e.g., the "short" lower trench having vertical sidewalls having a trench height less than 1.5 times its width or less than 1.5 times its length). Specifically, the fifth source of defect may be prevented by using a combined trench concept where upper trench 306 has an upper trench lower surface 216 and 217 above, open to, and completely surrounding the lower trench upper opening 240. The first, second, third source of sidewall defects may be prevented by having the upper trench 306 that use the concept of aspect ratio trapping (ART), such as by having a trench height at least 1.5 times its width and at least 1.5 times its length.

FIG. 5 shows combined trench 550 having an upper trench 306 formed between STI regions 307 and 308 and having lower surface (e.g., surfaces 216 and 217 and opening 303) above, open to and surrounding upper opening 240 of short vertical walled lower trench 505. Upper trench 306 may have lower opening 303 equal to or the same opening as upper opening 240 of lower trench 405 as noted for FIG. 4.

H3 of lower trench 505 may be larger than the W3 of the trench but the ratio H2/W3 is <1.5. In some cases, H3 is less than the W3. H3 of trench 505 may be larger than the L3 of the trench but the ratio H2/L3 is <1.5. In some cases, H3 is less than the L3. Trench 505 may be described as not being an ART trench.

For lower trench 505, FIG. 5 shows a schematic cross section view of a portion of a semiconductor substrate base 101 after selectively, epitaxially growing a type III-V or a Germanium (Ge) material 222 (and 532) on top surface 103 of substrate material 102 in trench 505 between shallow trench isolation (STI) regions 507 and 508 having short vertical sidewalls 513 and 515. Lower trench 505 may be similar to trench 405 of FIG. 3, but have height H3, width W3 and length L3. In some cases, growing material 222 (and 532) on top surface 103 in trench 505 of FIG. 5 may be similar to the descriptions above for growing material 122 on top surface 103 of substrate material 102 in trench 105 in FIG. 1 (e.g., where material 122 is grown to height H1).

Consequently, in some cases, trench 505 may be a shorter version of trench 405 (e.g., with any exceptions noted herein). In some cases, H3 is in a range of between 1 nm and <1.5×W3.

According to some embodiments, features 507, 508, 513, 515, 583, 585, 532, 533, 534 and 535 of lower trench 505 may be similar to features 407, 408, 413, 415, 483, 485, 432, 433, 434 and 435 of lower trench 405 of FIG. 3, respectively, with the exception of (1) having height H3 (e.g., as compared to height H2 of trench 405); and other exceptions noted below. More specifically trench 505 may be defined by or have a side at sidewall 513 of region 507; a side at sidewall 515 of region 508; a bottom at (or being) top surface 103 (having W3 and L3); a top at upper opening 240 (having W3 and L3); and top corners 411 and 412 adjacent to top surfaces 216 and 217 of regions 507 and 508. Trench sidewalls 513 and 515 may be short vertical (e.g., form a right angle with surface 103) with respect to the substrate surface 103. Material 532 may have (111) crystal orientation "vertical" sidewalls 583 and 585 touching (e.g., against or in direct contact with) STI "vertical" sidewalls 513 and 515, similar to descriptions above for sidewalls 123 and 125 touching (e.g., against or in direct contact with) STI "vertical" sidewalls 113 and 115 of FIG. 1.

FIG. 5, shows material 532 extending (e.g., growing) through opening 240, which may be similar to material 122 below surfaces 126 and 128 FIG. 1. Because of this, material 532; sidewalls 533 and 535; and top surface pyramidal shape 534, may be similar to material 122 of FIG. 1 below height H1, such as where defect sources 1-3 exist. In this case, the first, second, third source of sidewall defects may not be prevented by having lower trench 505 because height H3 is not at least 1.5 times width W3 and is not at least 1.5 times length L3. Thus, trench 505 does not provide aspect ratio trapping (ART), such as noted above for FIG. 1 (e.g., where material 122 is grown to height H1).

For upper trench 306, FIG. 5 shows a schematic cross section view of a portion of a semiconductor substrate base 101 after selectively, epitaxially growing a type III-V or a Germanium (Ge) material 322 (and 332) from one or more top surfaces of material 532 (or 222, which is grown from surface 103) in trench 306, and onto top surfaces 216 and 217 of STI regions 507 and 508; and grown between STI regions 307 and 308 having vertical sidewalls 313 and 315.

In some embodiments, materials 322; sidewalls 326, 327; top surfaces 323 and 325; and top surface pyramidal shape 324, may be similar in both FIGS. 4 and 5. This may be because material 322 is grown from one or more top surfaces (e.g., 533 and 535, or a planar surface of material 532 adjacent to surfaces 216 and 217, e.g., see 244 of FIG. 2) of material 532 (or 222, which are both grown from crystal seed layer or surface 103 of material 102), but material 322 is not grown from amorphous top surfaces 216 and 217 of STI regions 507 and 508. Because of this, in some cases, material 522 forms: (1) vertical (110) crystal oriented sidewalls 326 and 327 along the top of surfaces 216 and 217; as well as (2) top surfaces 323 and 325 above sidewalls 326 and 327 with a (111) crystal orientation.

According to embodiments, the growth of material 322 continues (e.g., during the same growth process or procedure) as material 332 as noted above. In some cases, because material 332 is grown from one or more top surfaces (e.g., 323 and 325) and one or more sidewalls (e.g., 326 and 327) of material 322 (which are both grown from crystal seed layer or surface 103 of material 102), but material 322 is not grown from amorphous top surfaces 216 and 217 of STI regions 207 and 208. Because of this, in some cases, material 332 continues to form: (1) vertical (110) crystal oriented sidewalls 336 and 337 along the top of surfaces 216 and 217; and forms a top surface pyrimidal shape 334 having top surfaces 333 and 335. Material 332 of sidewalls 336 and 337 having (110) crystal orientation may be touching (e.g., against or in direct contact with) STI sidewalls 313 and 315. In some cases sidewalls 336 and 337 are parallel to (e.g., form an angle of zero degrees with) STI sidewalls 313 and 315.

Growing material 322 (and 332) from one or more top surfaces (e.g., 533 and 535) of material 532 (or 222, which is grown from surface 103) into trench 306 of FIG. 5 may be different than the descriptions above for growing material 122 on top surface 103 of substrate material 102 in trench 105 in FIG. 1, because material 322 may be a grown over but not from amorphous top surfaces 216 and 217 of STI regions 207 and 208. More specifically, in some cases, as material 322 grows along edges 230 and 231, it grows with or has a (110) crystal orientation as it grows to form vertical sidewalls 326 and 327 which touch sidewalls 313 and 315. Consequently, in these cases, the other features of trench 306 may be similar to trench 306 (e.g., with any exceptions noted herein).

In some cases, the fifth source of sidewall defects may not be prevented in material 532 due to trench having the sloped sidewalls at an angle of between 40 degrees and 70 degrees (e.g., such as 55 degrees) with respect to the substrate surface (e.g., see FIG. 2 description of trench 305). However, according to embodiments, the fifth source of sidewall defects may be prevented in material 532 by using combined trench 550 with upper trench 306 having upper trench lower STI surfaces 216 and 217 above, open at lower opening 303 to, and completely surrounding lower trench 505 upper opening 240.

According to embodiments, trenches 505, 306 and 550 and their sidewalls may be formed by patterning and etching. More detailed embodiments of processes for forming trenches 505, 306 and 550 and their sidewalls is provided below with respect to FIGS. 8A-I and 10.

Epitaxial material 322 may be a selectively grown (e.g., deposited) epitaxial layer of epitaxial material in trench 306 that is grown from top surfaces 533 and 535 of material 532 (or 222, which is grown from surface 103) in trench 306, and over amorphous top surfaces 216 and 217 of STI regions 507 and 508, between vertical sidewalls 313 and 315, as described above for growing material 322 from surfaces of material 232. Material 322 may be an epitaxially grown crystal buffer material, grown from a single crystal Silicon (Si) substrate surface 103, which is initially grown as material 222, then 532, then 322 during the same growth process or processing period or "step".

In some cases, the choice of (e.g., predetermined) growth conditions for material 322 are similar to those for material 222. In some cases, the growth of material 322 is grown selectively from a top surface of material 532 by choosing or using a predetermined growth temperature range, pressure of gas flux range, etc., as known for material 322 to grow from material 532, but not grow from or initiate on material of the STI top surfaces 216 and 217, or STI sidewalls 313 and 315 of regions 207 and 208.

In some cases combined trench 550 or the desciptions above for FIG. 5 reduce or prevent the first, second, third and fifth source of sidewall defects by selectively, epitaxially growing a type III-V or a Germanium (Ge) single crystal material on a top surface 103 of a substrate material in combined trench 550 having upper trench 306 over and surrounding opening 240 of lower trench 505. In this case, the fifth source of defect may be prevented by using combined trench 550 with upper trench 306 having upper trench lower STI surfaces 216 and 217 above, open at lower opening 303 to, and completely surrounding lower trench 505 upper opening 240. The first, second, third source of sidewall defects may be prevented by having upper trench 306 with height H1 at least 1.5 time width W1 and at least 1.5 time length L1 to provide aspect ratio trapping (ART), such as noted above for FIG. 1 (e.g., where material 122 is grown to height H1).

For example, the first, second, third and fifth source of crystaline defects in the trench buffer material may not extend into or not exist in the device epitaxy regions or material where devices are formed (e.g., the upper device material above material 332). Thus, device fins formed or grown from the top surfaces of the buffer material may provide electronic device material (e.g., wells and channels) in which reduced defect or defect free fin based devices may be formed, thus providing faster or increased performance, increased yield, and fewer variation issues in circuit devices built on or in the device material.

Figure 6:
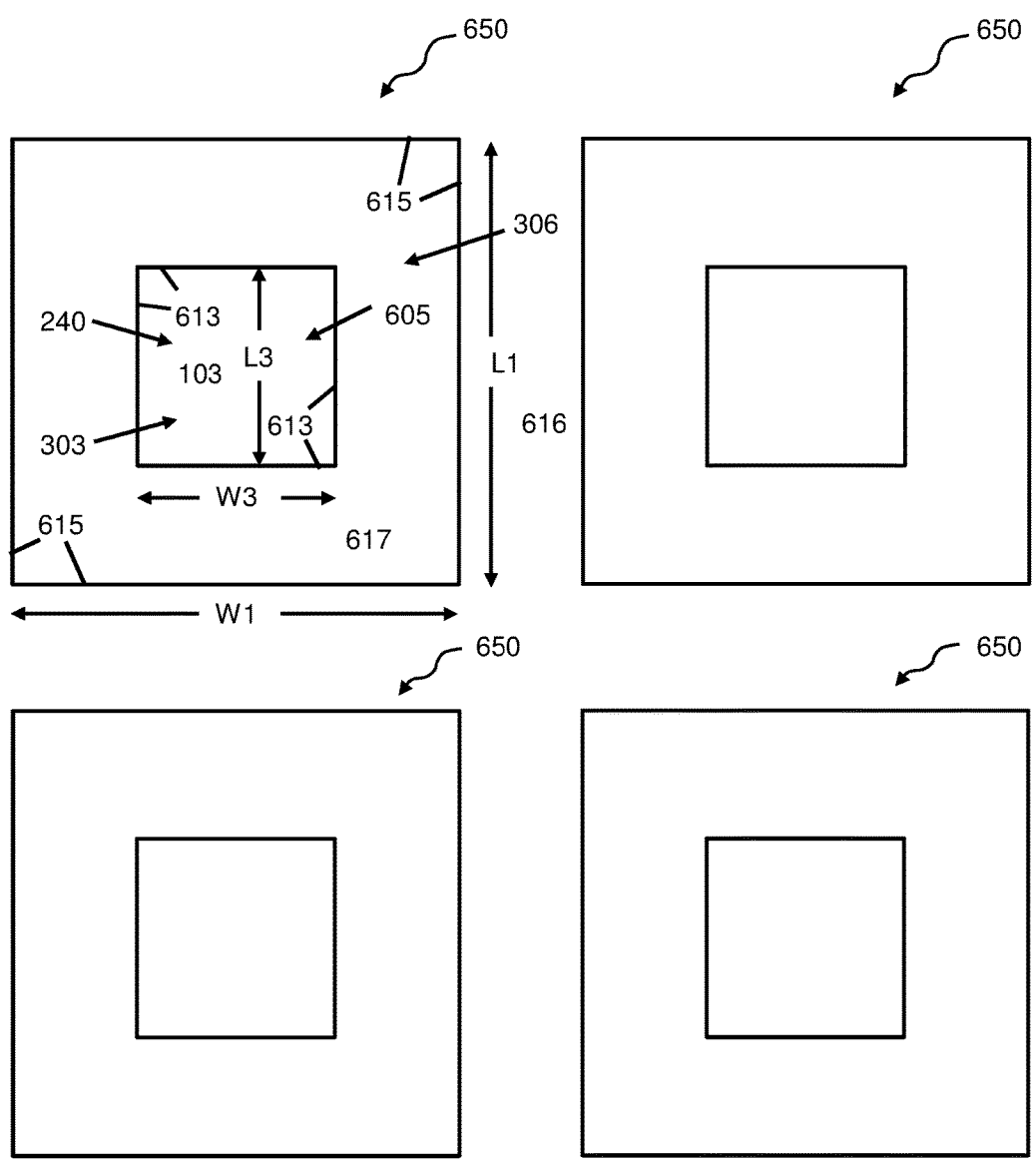
FIG. 6 is a schematic top view of a portion of a semiconductor substrate base having combined trenches formed over the base.

FIG. 6 is a schematic top view of a portion of a semiconductor substrate base have combined trenches formed over the base. FIG. 6 shows semiconductor substrate base 101 of material 102 from above after forming combined trenches 650 over the base.

Combined trenches 650 are shown with upper trench 306 having sidewalls 615, lower surface 617, lower opening 303, width W1 and length L1. In some cases, a bottom surface of trench 306 may be described as lower surface 617 and lower opening 303.

Trenches 650 or 306 have upper surface 616. Lower trench 605 is shown below upper trench 306. Lower trench 605 has sidewalls 613, lower surface 103, and upper opening 204 with width W3 and length L3.

According to embodiments, combined trenches 650 may be any of combined trenches 350, 450 or 550 as described herein. In some cases, upper surface 616 may be or represent both surface 316 and 317. According to embodiments, sidewalls 615 may be or represent sidewalls 313 and 315. In some cases, lower surface 617 may be or represent both surface 216 and 217. According to embodiments, lower trench 605 may be any of trenches 300, 405 or 505 as described herein. According to embodiments, sidewalls 613 may be or represent sidewalls 213 and 215, sidewalls 313 and 315, sidewalls 413 and 415, or sidewalls 513 and 515.

According to some embodiments, openings 240 and 303 have the same vertical axis or center (e.g., into the page). In some cases, combined trench 650 has upper trench lower surfaces 617 completely surrounding upper opening 240, by extending at least 5 to 10 nm outward from opening 240 in all directions. In some cases, upper trench lower surfaces 617 completely surrounding opening 240 includes opening 240 being an island in the middle of surfaces 617. In some cases, upper trench lower surfaces 617 forming a square (e.g., as shown) or rectangular perimeter around opening 240.

According to embodiments the structures and embodiments described for FIGS. 2-6 include the STI sidewalls coinciding with or having an inner planar surfaces in directions (e.g., directions L and W as shown in FIGS. 2-6) along the (110) crystal structure direction of surface 103. In some cases, this includes the embodiments described for FIGS. 2-6 including STI sidewalls (e.g., sidewalls 613 and 615) coinciding with or having an inner planar surface of the sidewalls in a direction (e.g., directions L1, L2, L3, W1, W2 and W3) along or parallel to the (110) crystal structure direction of surface 103. In some cases, STI sidewalls 613 and 615 coincide with the 110 direction of the substrate, such as where the 110 direction includes the entire family of 110 directions (e.g., 011, 101, etc., which may be represented by <110>). In some embodiments, this 110 direction may be represented in materials science terminology where a family of directions is designated by use of special brackets "< >", as "<110>". In these cases, the STI sidewalls 613 and 615 are possible (e.g., work) from a patterning point of view (e.g., to create between 40 degrees and 70 degrees (e.g., such as 55 degrees) sloped trench sidewalls 213 and 215) and lateral epitaxial growth of the (110) plane point of view (e.g., for the 110 growth front sidewalls 326 and 327 to approach the STI sidewalls 313 and 315 at 0-degrees) because the STI sidewalls of the trenches coincided exactly with the 110 direction of the substrate.

According to embodiments, FIGS. 7A-I may show a process of patterning and etching for forming combined trench 350. According to embodiments, FIGS. 7A-D may show a process of patterning and etching for forming STI regions 207 and 208 to form trench 205 (or lower trench 305). According to embodiments, FIGS. 7E-I may show a process of patterning and etching for forming regions 307 and 308 to form upper trench 306; and to form combined trench 350.

Figure 7A:
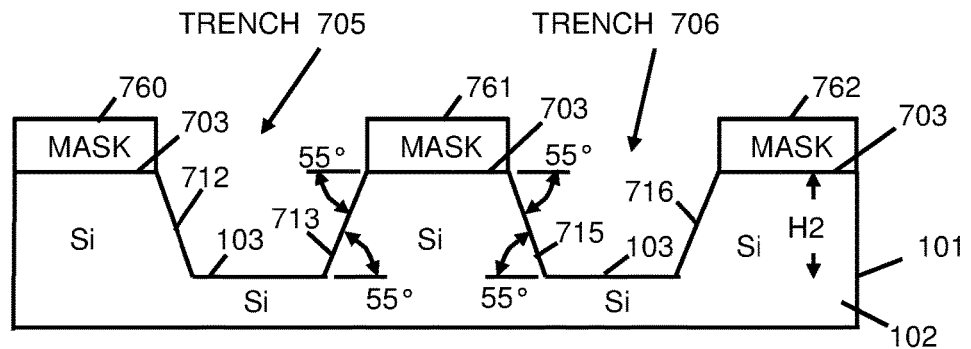
FIG. 7A shows a semiconductor substrate after covering areas of the top surface of the substrate where trenches are to be formed with a mask; and exposing unmasked areas of the top surface of the substrate next to the masked areas to a wet chemical etchant that etches the substrate anisotropically to form trenches which have outward sloping between 40 degrees and 70 degrees (e.g., such as 55 degrees) sidewalls.

FIG. 7A shows a semiconductor substrate after covering areas of the top surface of the substrate where trenches are to be formed with a mask; and exposing unmasked areas of the top surface of the substrate next to the masked areas to a wet chemical etchant that etches the substrate anisotropically to form trenches which have outward sloping between 40 degrees and 70 degrees (e.g., such as 55 degrees) sidewalls. FIG. 7A shows pattern or masks 760-762 formed on (e.g., touching) top surface 703 of material 102 of substrate 101. Semiconductor substrate 101, material 102 and top surface 103 may be the same as the description for those features in FIGS. 1-5. Surface 703 may be similar to surface 103 but above surface 103, such as by being at or above height H2 above surface 103. In some cases, these masks have width W3 and length L3. These masks may be formed by or of photoresist alone, or a photoresist/oxide combination; or a photoresist/nitride combination, such as known in the art. This may include patterning by covering areas of Silicon of surface 703 where the trenches are to be formed with masks (e.g., a nitride material), such as masks 760-762.

FIG. 7A also shows trenches 705 and 706 formed by etching surface 103 between masks 760-762 with a wet chemical etchant that etches silicon anisotropically. This etching may form sidewalls 712-716 of trenches 705 and 706 having a between 40 degrees and 70 degrees (e.g., such as 55 degrees) angle with respect to surface 703. This may include selectively etching the silicon material (e.g., material 102), with respect to (e.g., not etching) masks 760-762, to remove the silicon material (e.g., material 102) down to surface 103. This may include etching to form trenchs by exposing unmasked Silicon surface 703 next to the masked areas to a wet chemical etchant that etches silicon anisotropically (along preferred lattice planes). In some cases, this includes using a potassium hydroxide etch (anisotropic wet etch of silicon) to result in trenches in silicon which have outward sloping between 40 degrees and 70 degrees (e.g., such as 55 degrees) sidewalls (top opening larger than bottom). The angle of between 40 degrees and 70 degrees (e.g., such as 55 degrees) degrees may result from using a wet anisotropic etch that removes silicon along lattice planes, thus removing the silicon along a (111) lattice plane.

Figure 7B:
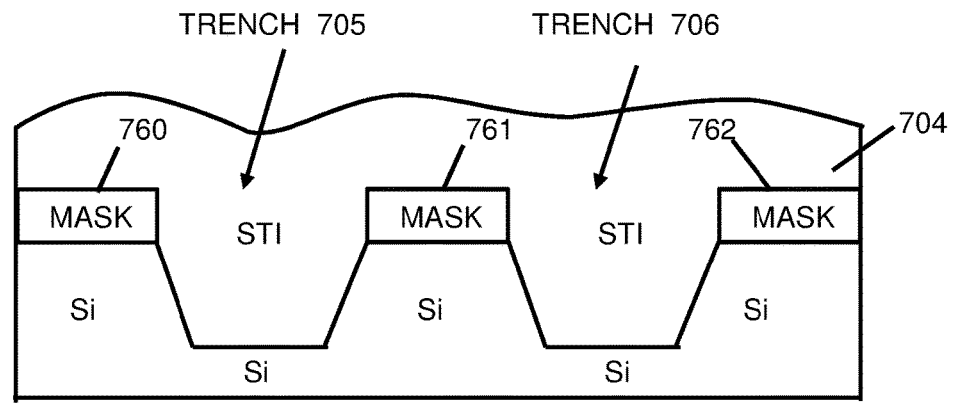
FIG. 7B shows the semiconductor substrate of FIG. 7A after filling the between 40 degrees and 70 degrees (e.g., such as 55 degrees) outward sloping trenches with shallow trench isolation (STI) material.

FIG. 7B shows the semiconductor substrate of FIG. 7A after filling the between 40 degrees and 70 degrees (e.g., such as 55 degrees) outward sloping trenches with shallow trench isolation (STI) material. FIG. 7B shows trenches 705 and 706 filled in with STI material 704 to a height above masks 760-762. STI material 704 may be a blanket layer of STI material over (e.g., touching) all the exposed surfaces above substrate 101. This may include depositing STI material by filling the between 40 degrees and 70 degrees (e.g., such as 55 degrees) outward sloping trenches with isolation-oxide (STI).

Figure 7C:
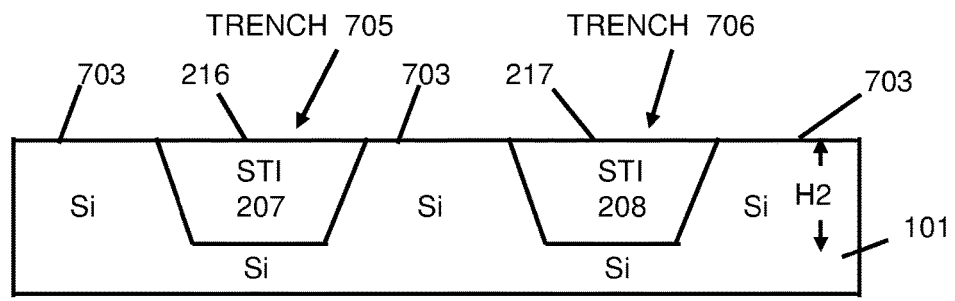
FIG. 7C shows the semiconductor substrate of FIG. 7A after removing the masks of the original areas of the top surface of the substrate that were covered with the masks to expose the top surface of the substrate there.

FIG. 7C shows the semiconductor substrate of FIG. 7A after removing the masks of the original areas of the top surface of the substrate that were covered with the masks to expose the top surface of the substrate there. FIG. 7C shows STI material 704 planarized to a height (e.g., height H2) to expose surfaces 703 of substrate 101; to expose top surfaces 216 and 217 of STI material regions 207 and 208 in trenches 705 and 706; and to remove masks 760-762.

This may include forming STI regions 207 and 208 by removing the masks 760-762 of the original Si areas covered with the masks to expose the silicon there so that the original Si areas isolate regions 207 and 208 of the STI material 704. Polishing or planarizing STI material 704 may be performed by chemical, physical or mechanical polishing as known in the art to remove STI material 704 and masks 760-762, to form top planar surfaces 216 and 217 of new STI isolation-oxide material regions 207 and 208.

Figure 7D:
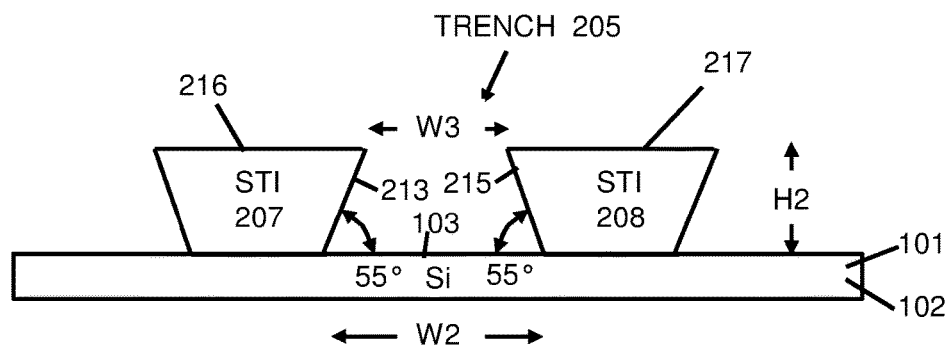
FIG. 7D shows the semiconductor substrate of FIG. 7A after etching the exposed original areas of the top surface of the substrate using isotropic etching; thus providing trenches in oxide with between 40 degrees and 70 degrees (e.g., such as 55 degrees) inward-sloping sidewalls, with the silicon exposed only at the bottom of the trench.

FIG. 7D shows the semiconductor substrate of FIG. 7A after etching the exposed original areas of the top surface of the substrate using isotropic etching; thus providing trenches in oxide with between 40 degrees and 70 degrees (e.g., such as 55 degrees) inward-sloping sidewalls, with the silicon exposed only at the bottom of the trench. FIG. 7D shows trench 205 (or 305) formed by etching surfaces 703 between STI regions 207 and 208 to remove height H2 to expose or form (e.g., planar) surface 103 of material 102 using wet (or optionally, dry) isotropic etching (e.g., no preferential etching along crystallographic planes) to create trench 205 with between 40 degrees and 70 degrees (e.g., such as 55 degrees) inward-sloping sidewalls 213 and 215, and bottom surface 103. This may include selectively etching the silicon material (e.g., material 102), with respect to (e.g., not etching) the STI material of regions 207 and 208, to remove the silicon material (e.g., material 102) down to surface 103. This trench may have height H2, bottom width W2 and top width W3 and length L3. This may include forming trench 205 (or 305) with between 40 degrees and 70 degrees (e.g., such as 55 degrees) inward-sloping sidewalls by etching the exposed Si 703 in the original areas using isotropic etching (no preferential etching along crystallographic planes), a dry etch may be used here; thus providing trenches 205 (or 305) in oxide with between 40 degrees and 70 degrees (e.g., such as 55 degrees) inward-sloping sidewalls 213 and 215, with the silicon 103 exposed only at the bottom of the trench. Such sidewalls may be sidewalls 213 and 215 of STI regions 207 and 208; or may form trench 205 or 305 as described for FIGS. 2-3.

According to embodiments, after FIGS. 7A-D a type III-V or a Germanium (Ge) material may be selectively, epitaxially grown in trench 205 or 305, such as described for FIGS. 2-3 (e.g., materials 222 and 232).

According to embodiments, FIGS. 7E-I may show a process of patterning and etching for forming regions 307 and 308 (e.g., trench 306).

Figure 7E:
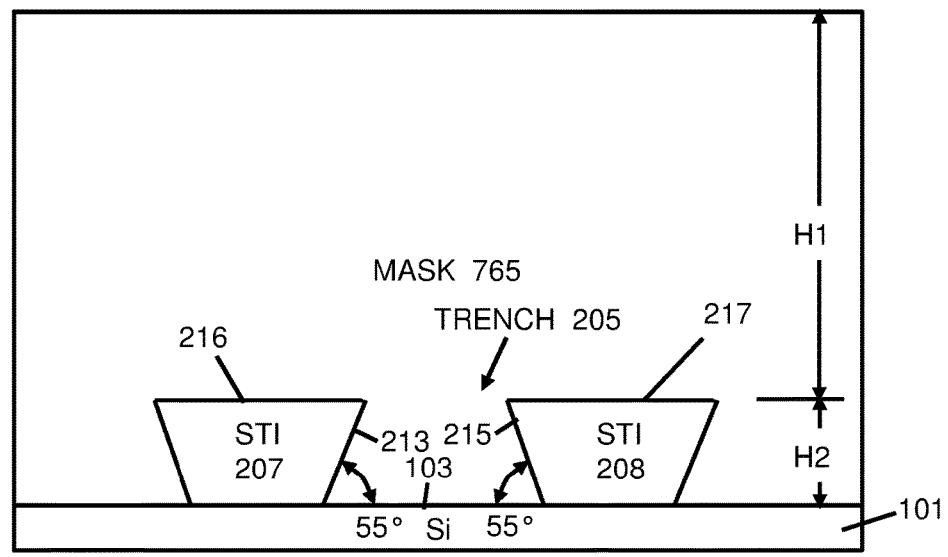
FIG. 7E shows the semiconductor substrate of FIG. 7A after filling in the lower trench having between 40 degrees and 70 degrees (e.g., such as 55 degrees) inward-sloping sidewalls with another mask.

FIG. 7E shows the semiconductor substrate of FIG. 7A after filling in the lower trench having between 40 degrees and 70 degrees (e.g., such as 55 degrees) inward-sloping sidewalls with another mask. FIG. 7E shows trench 205 (or 305) filled with a pattern or masks 765 formed on (e.g., touching) top surfaces 103 of material 102; and surfaces 216 and 216 to a height equal to or above height H1 over surfaces 216 and 216. This may also include filling in trench trench 205 or 305 (e.g., trenches as described for FIGS. 2-3). Mask 765 may be a blanket mask over (e.g., touching) all the exposed surfaces above substrate 101. In some cases, this masks may be formed by or of photoresist alone, or a photoresist/oxide combination; or a photoresist/nitride combination. This may include deposition of mask material 765 by filling in trench 205 having between 40 degrees and 70 degrees (e.g., such as 55 degrees) inward-sloping sidewalls 213 and 215 between the old STI regions 207 and 208 (e.g., formed at FIG. 7D above) with another mask (e.g., a nitride hardmask 765) to a height above the sidewalls and planarizing the mask (e.g., down to height H2 plus H1 above surface 103). Polishing or planarizing mask 765 may be performed by chemical, physical or mechanical polishing as known in the art to remove mask material 765, to form a top planar surfaces of mask 765.

Figure 7F:
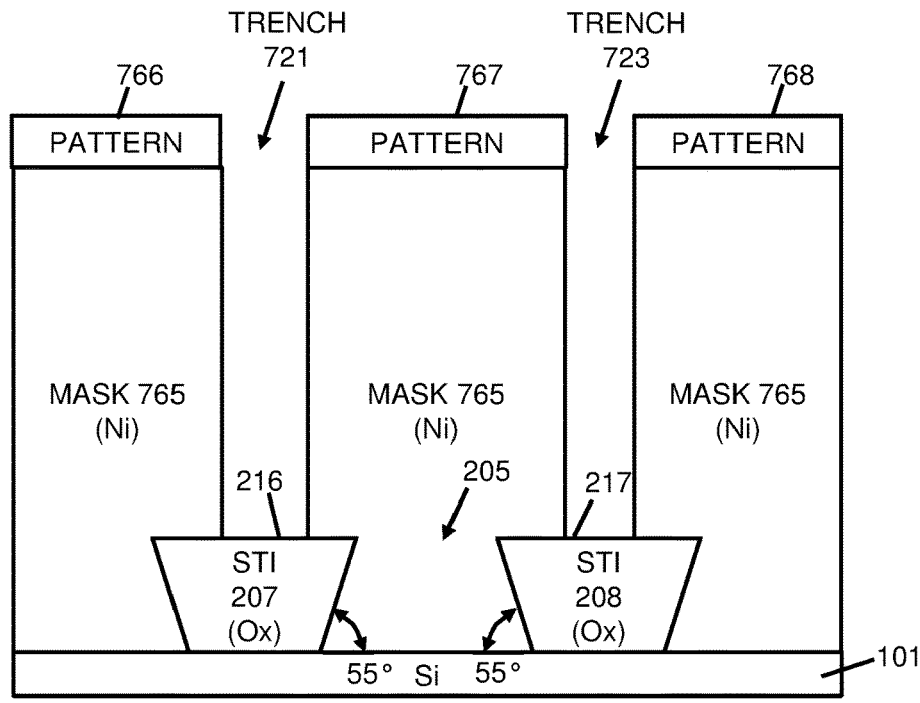
FIG. 7F shows the semiconductor substrate of FIG. 7A after patterning and etching the new, other mask to form openings to the old STI regions, thus creating larger square mesas of the new mask over the lower trench.

FIG. 7F shows the semiconductor substrate of FIG. 7A after patterning and etching the new, other mask to form openings to the old STI regions, thus creating larger square mesas of the new mask over the lower trench. FIG. 7F shows pattern or masks 766-768 formed on a top surface of mask 765, and trenches 721 and 723 etched to expose surfaces 216 and 217 of regions 207 and 208. In some cases, masks 766-768 have width length L1. Masks 766-768 may be formed by or of photoresist alone, or a photoresist/oxide combination; or a photoresist/nitride combination. This may include patterning and etching to form trenches 721 and 723 by lithographically patterning and etching the new mask 765 to form openings 721 and 723 to STI regions 207 and 208, thus creating larger square mesas of mask 765 (larger than the lower trench width W2) of the new mask 765 over the lower trench 205.

Figure 7G:
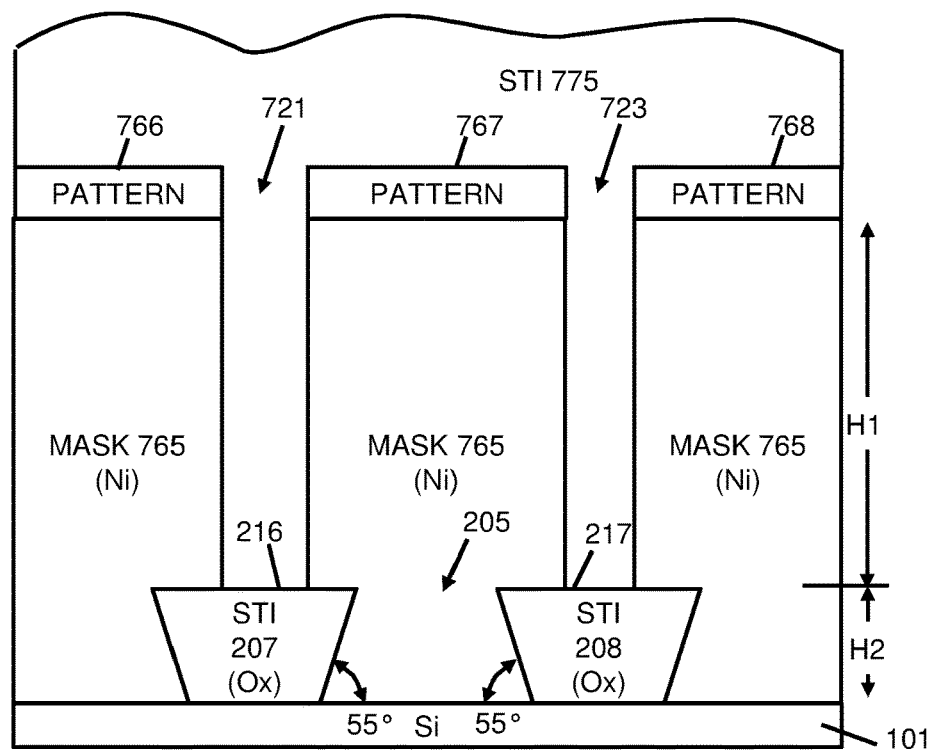
FIG. 7G shows the semiconductor substrate of FIG. 7A after filling the openings to the old STI regions with shallow isolation-oxide (STI) material.

FIG. 7G shows the semiconductor substrate of FIG. 7A after filling the openings to the old STI regions with shallow isolation-oxide (STI) material. FIG. 7G shows trenches 721 and 723 filled with STI material 775 on (e.g., touching) surfaces 216 and 216 to a height equal to or above height H1 over surfaces 216 and 216. STI material 775 may be a blanket STI material over (e.g., touching) all the exposed surfaces above substrate 101. This may include depositing STI material to fill trenches 721 and 723 by filling the openings to STI regions 207 and 208 with new isolation-oxide (STI) 775.

Figure 7H:
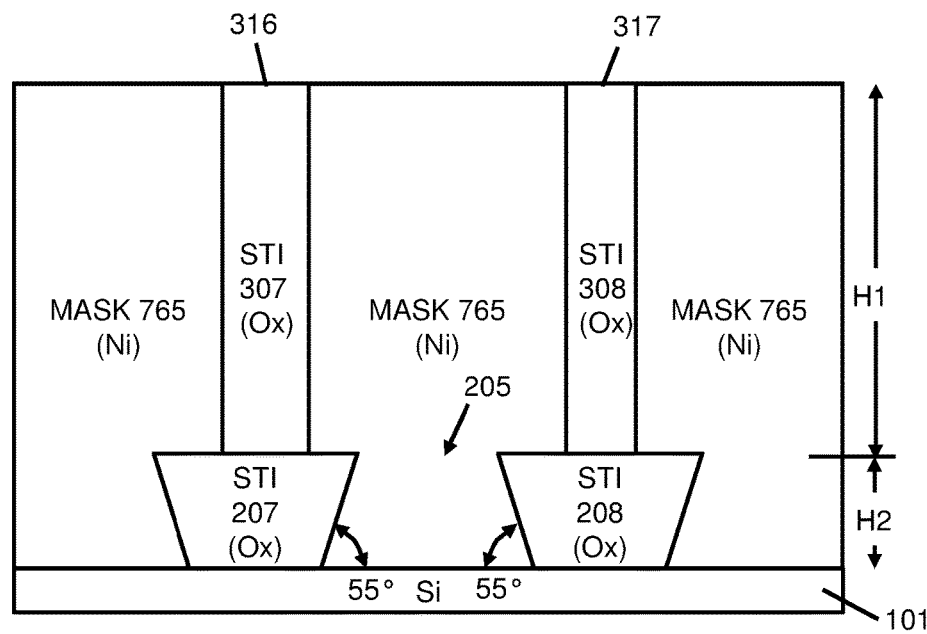
FIG. 7H shows the semiconductor substrate of FIG. 7A after polishing the new STI isolation-oxide to expose the larger square mesas of the new, other mask and the new oxide/STI in the openings to the old STI regions.

FIG. 7H shows the semiconductor substrate of FIG. 7A after polishing the new STI isolation-oxide to expose the larger square mesas of the new, other mask and the new oxide/STI in the openings to the old STI regions. FIG. 7H shows STI material 775 planarized to a height (e.g., height H1) to expose mask 765; to create expose top surfaces 316 and 317 of STI material regions 307 and 308 in trench 306; and to remove masks 766-768. This may include forming STI regions 307 and 308 by polishing the isolation-oxide 775 to (1) expose the larger square mesas 765 of the new, other mask 765 (e.g., nitride) over the lower trench 405, (2) expose surfaces 316 and 317 of oxide in the openings 721 and 732 to STI regions 207 and 208, thus forming regions 307 and 308 of the STI material 775. Polishing or planarizing STI material 775 may be performed by chemical, physical or mechanical polishing as known in the art to form top planar surfaces 316 and 317 of new STI isolation-oxide material regions 307 and 308.

Figure 7I:
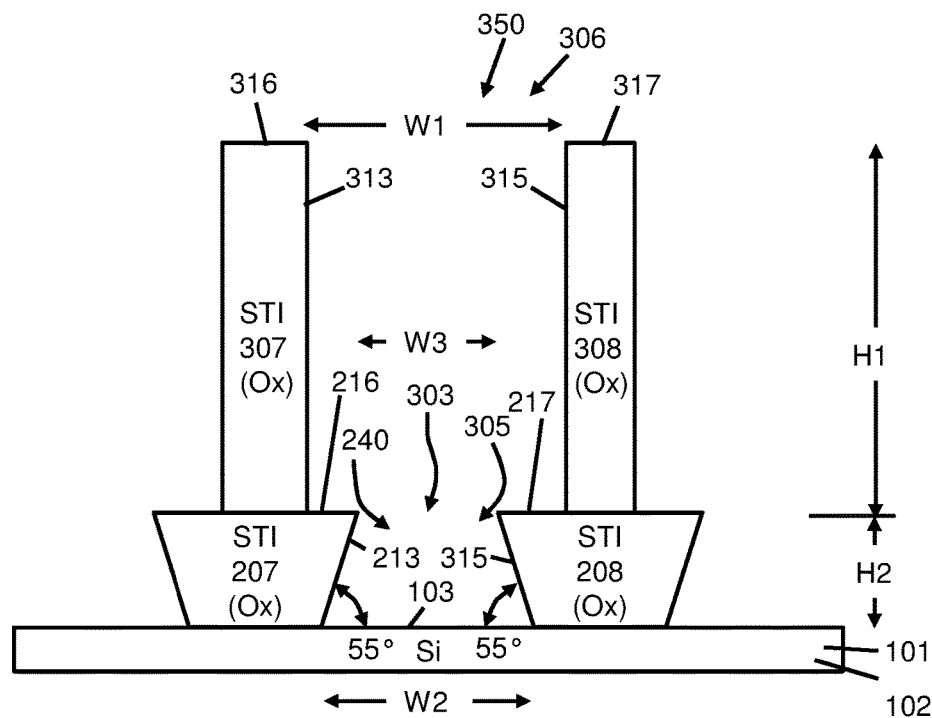
FIG. 7I shows the semiconductor substrate of FIG. 7A after selectively etching or removing the larger square mesas of the new, other mask over the lower trench without removing any new oxide, so that the new oxide in the openings to the old STI regions remains; thus providing an upper trench in oxide with vertical sidewalls and having a lower opening over and surrounding an upper opening of a lower trench having between 40 degrees and 70 degrees (e.g., such as 55 degrees) inward-sloping sidewalls.

FIG. 7I shows the semiconductor substrate of FIG. 7A after selectively etching or removing the larger square mesas of the new, other mask over the lower trench (e.g., nitride) without removing any new oxide, so that the new oxide in the openings to the old STI regions remains; thus providing an upper trench in oxide with vertical sidewalls and having a lower opening over and surrounding an upper opening of a lower trench having between 40 degrees and 70 degrees (e.g., such as 55 degrees) inward-sloping sidewalls. FIG. 7I shows trenches 306 and 305 (e.g., formed from trench 205) which may be formed by selectively etching mask material 765 with respect to material of STI regions 207, 208, 307 and 308, and substrate material 102; to create or expose trenches 306 and 305 of combined trench 350. Trenches 306 and 305 may be formed by etching to form them separately or simultaneously (e.g., trench 305 is formed during the same etch process or as an immediate chemical etching continuation of etching to form trench 306).

Trenches 306 and 305 may be formed by etching surfaces of mask 765 regions between STI regions 207, 208, 307 and 308 using wet (or optionally, dry) isotropic etching (e.g., no preferential etching along crystallographic planes). This etching may remove height H1 of mask 765 to expose or form top (e.g., planar) surfaces 216 and 217 of regions 207 and 208, and openings 303 and 240, to create trench 306 with vertical sidewalls 313 and 315. This etching may also remove height H2 of mask 765 to expose or form top (e.g., planar) surface 103 of material 102, to create trench 305 with between 40 degrees and 70 degrees (e.g., such as 55 degrees) inward-sloping sidewalls 213 and 215, and bottom surface 103. This may include selectively etching the mask 765 material with respect to (e.g., not etching) the STI material of regions 207, 208, 307 and 308, to remove the mask 765 down to surface 103. In some cases, this may include selectively etching the mask 765 material with respect to material 102. Such etching may include etching the exposed etching the mask 765 material using wet (or optionally dry) isotropic etching (no preferential etching along crystallographic planes). Etching to form trench 306 may include forming trench 306 by selectively etching or removing the larger square mesas 765 of the new mask 765 (e.g., nitride) over the lower trench 205 without removing any oxide of regions, so that the oxide in the openings to STI regions 207 and 208 remains; thus providing upper trench 306 in oxide regions 307 and 308 (with vertical sidewalls 313 and 315) over and surrounding upper opening 240 of sloped walled lower trench 305. The upper trench 306 may have height H1, bottom width W1 and length L1, where height H1 is >=1.5 times W1 and >=1.5 times L1 such as described above for FIG. 1.

Trench 306 sidewalls may include sidewalls 313 and 315 of STI regions 307 and 308; or may form trench 306 as described for FIGS. 3-5. According to embodiments, after FIGS. 7A-I a type III-V or a Germanium (Ge) material may be selectively, epitaxially grown in combined trench 350, such as described for FIG. 3 (e.g., materials 222, 232, 322 and 332).

According to embodiments, FIGS. 8A-I may show a process of patterning and etching for forming combined trench 450 or 550. According to embodiments, FIGS. 8A-D may show a process of patterning and etching for forming STI regions 407 and 408 to form lower trench 405. In some cases, FIGS. 8A-D may show a process of patterning and etching for forming STI regions 507 and 508 to form lower trench 505. According to embodiments, FIGS. 8E-I may show a process of patterning and etching for forming regions 307 and 308 to form upper trench 306; and to form combined trench 450 or 550.

Figure 8A:
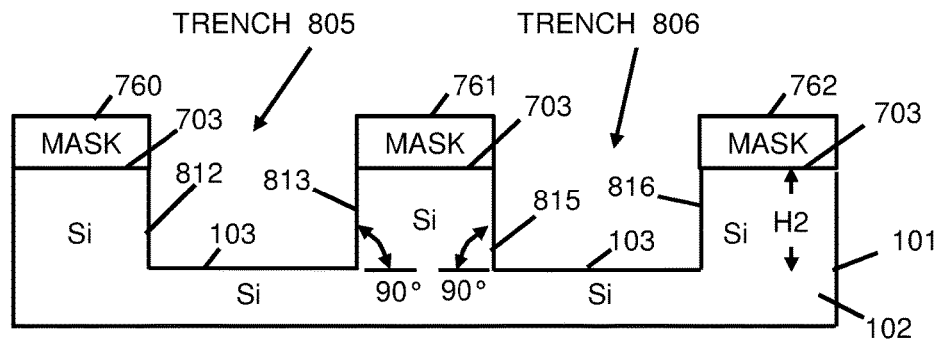
FIG. 8A shows a semiconductor substrate after covering areas of the top surface of the substrate where trenches are to be formed with a mask; and exposing unmasked areas of the top surface of the substrate next to the masked areas to a dry chemical etchant that etches the substrate anisotropically to form trenches which have vertical sidewalls.

FIG. 8A shows a semiconductor substrate after covering areas of the top surface of the substrate where trenches are to be formed with a mask; and exposing unmasked areas of the top surface of the substrate next to the masked areas to a dry chemical etchant that etches the substrate anisotropically to form trenches which have vertical sidewalls. FIG. 8A shows pattern or masks 760-762 formed on (e.g., touching) top surface 703 of material 102 of substrate 101. Semiconductor substrate 101, material 102 and top surface 103 may be the same as the description for those features in FIGS. 1-5. Surface 703 may be similar to surface 103 but above surface 103, such as by being at or above height H2 above surface 103. In some cases, these masks have width W3 and length L3. These masks may be formed by or of photoresist alone, or a photoresist/oxide combination; or a photoresist/nitride combination, such as known in the art. This may include patterning by covering areas of Silicon of surface 703 where the trenches are to be formed with masks (e.g., a nitride material), such as masks 760-762.

FIG. 8A also shows trenches 805 and 806 formed by etching surface 103 between masks 760-762 with a dry chemical etchant that etches silicon anisotropically. This etching may form vertical sidewalls 812-816 of trenches 805 and 806 having a 90 degree angle with respect to surface 703. This may include selectively etching the silicon material (e.g., material 102), with respect to (e.g., not etching) masks 760-762, to remove the silicon material (e.g., material 102) down to surface 103. This may include etching to form trenchs by exposing unmasked Silicon surface 703 next to the masked areas to a dry chemical etchant that etches silicon anisotropically (along preferred lattice planes). In some cases, this includes using a Chlorine or another acidic dry chemistry (anisotropic dry etch of silicon) to result in trenches in silicon which have vertical sidewalls. In some cases, other such chemistries may include a "halogen" to in place of or to supplement the Chlorine. Such a halogen may include Fluorine; or combinations of Clorine and Fluorine.

Figure 8B:
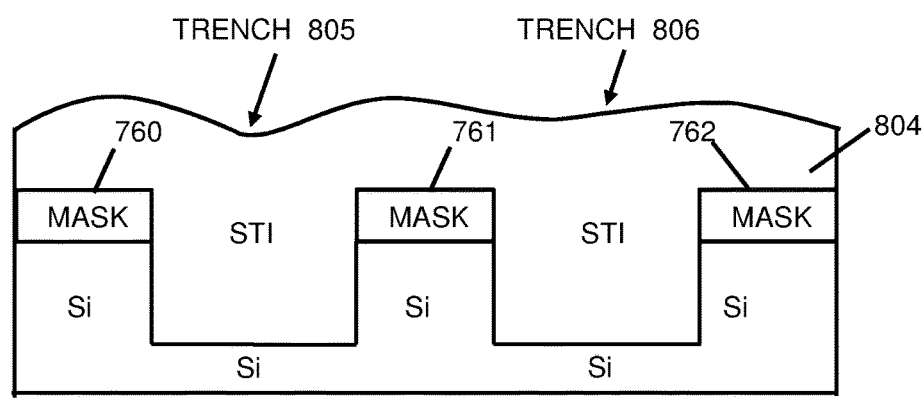
FIG. 8B shows the semiconductor substrate of FIG. 8A after filling the vertical sidewall trenches with shallow trench isolation (STI) material.

FIG. 8B shows the semiconductor substrate of FIG. 8A after filling the vertical sidewall trenches with shallow trench isolation (STI) material. FIG. 8B shows trenches 805 and 806 filled in with STI material 804 to a height above masks 760-762. STI material 804 may be a blanket layer of STI material over (e.g., touching) all the exposed surfaces above substrate 101. This may include depositing STI material by filling vertical sidewall trenches with isolation-oxide (STI).

Figure 8C:
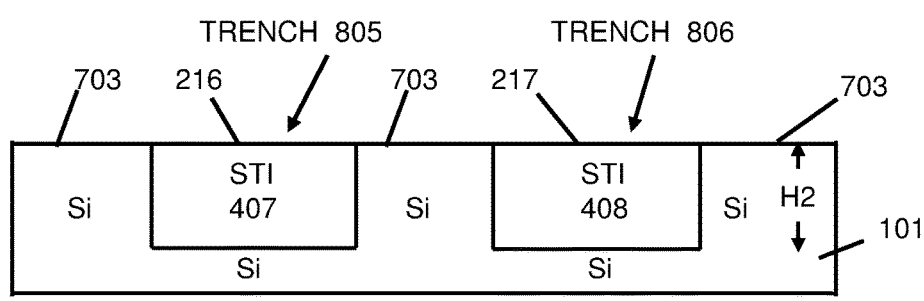
FIG. 8C shows the new STI material planarized to a height to expose surfaces of substrate; to expose top surfaces of STI material regions in the trenches; and to remove the masks.

FIG. 8C shows the semiconductor substrate of FIG. 8A after removing the masks of the original areas of the top surface of the substrate that were covered with the masks to expose the top surface of the substrate there. FIG. 8C shows STI material 804 planarized to a height (e.g., height H2) to expose surfaces 703 of substrate 101; to expose top surfaces 216 and 217 of STI material regions 407 and 408 in trenches 805 and 806; and to remove masks 760-762.

This may include forming STI regions 407 and 408 by removing the masks 760-762 of the original Si areas covered with the masks to expose the silicon there so that the original Si areas isolate regions 407 and 408 of the STI material 804. Polishing or planarizing STI material 804 may be performed by chemical, physical or mechanical polishing as known in the art to remove STI material 804 and masks 760-762, to form top planar surfaces 216 and 217 of new STI isolation-oxide material regions 407 and 408.

Figure 8D:
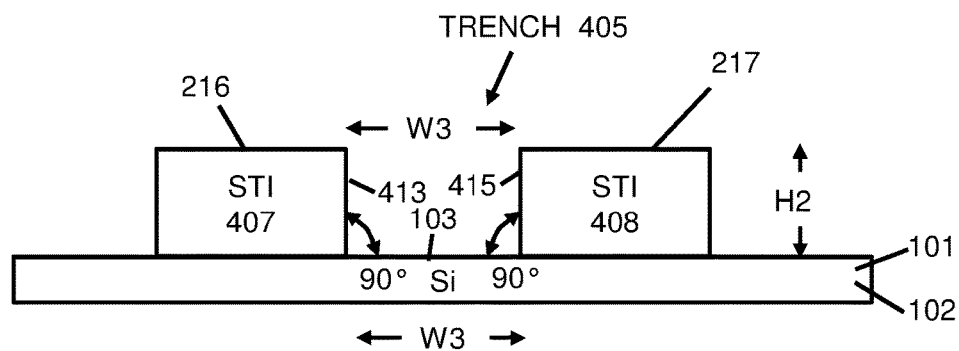
FIG. 8D shows the semiconductor substrate of FIG. 8A after etching the exposed original areas of the top surface of the substrate using isotropic etching; thus providing trenches in oxide with vertical sidewalls, with the silicon exposed only at the bottom of the trench.

FIG. 8D shows the semiconductor substrate of FIG. 8A after etching the exposed original areas of the top surface of the substrate using isotropic etching; thus providing trenches in oxide with vertical sidewalls, with the silicon exposed only at the bottom of the trench. FIG. 8D shows trench 405 formed by etching surfaces 703 between STI regions 407 and 408 to remove height H2 to expose or form (e.g., planar) surface 103 of material 102 using wet (or optionally, dry) isotropic etching (e.g., no preferential etching along crystallographic planes) to create trench 405 with vertical sidewalls 413 and 415, and bottom surface 103. This may include selectively etching the silicon material (e.g., material 102), with respect to (e.g., not etching) the STI material of regions 407 and 408, to remove the silicon material (e.g., material 102) down to surface 103. This may include forming trench 405 with vertical sidewalls by etching the exposed Si 703 in the original areas using isotropic etching (no preferential etching along crystallographic planes), a dry etch may be used here; thus providing trench 405 in oxide with vertical sidewalls 413 and 415, with the silicon 103 exposed only at the bottom of the trench. Such sidewalls may be sidewalls 413 and 415 of STI regions 407 and 408; or may form trench 405 as described for FIG. 4. This trench may have height H2, and width W3 and length L3, where height H2 is >=1.5 times W3 and >=1.5 times L3 such as described above for FIG. 4.

According to embodiments, after FIGS. 8A-D a type III-V or a Germanium (Ge) material may be selectively, epitaxially grown in trench 405, such as described for FIG. 4 (e.g., materials 222 and 432).

According to embodiments, STI regions 507 and 508 having height H3 can be formed in FIGS. 8A-D to form trench 405 as described for FIG. 5, instead of forming STI regions 407 and 408 having height H2 as described in FIGS. 8A-D. This embodiment may include the descriptions above for FIGS. 8A-D but having the trench 505 formed with height H3, instead of trench 405 formed with height H2, as described for FIGS. 4-5. This trench may have height H3, and width W3 and length L3, where height H2 is <1.5 times W3 and <1.5 times L3 such as described above for FIG. 5. Also, for this embodiment, according to embodiments, after FIGS. 8A-D a type III-V or a Germanium (Ge) material may be selectively, epitaxially grown in trench 505, such as described for FIG. 5 (e.g., materials 222 and 532).

According to embodiments, FIGS. 8E-I may show a process of patterning and etching for forming regions 307 and 308 (e.g., trench 306). These descriptions may be similar to the descriptions above for figures FIGS. 7E-I, but FIGS. 8E-I may form trench 306 above trench 405 or 505, such as described for FIG. 4 or 5.

Figure 8E:
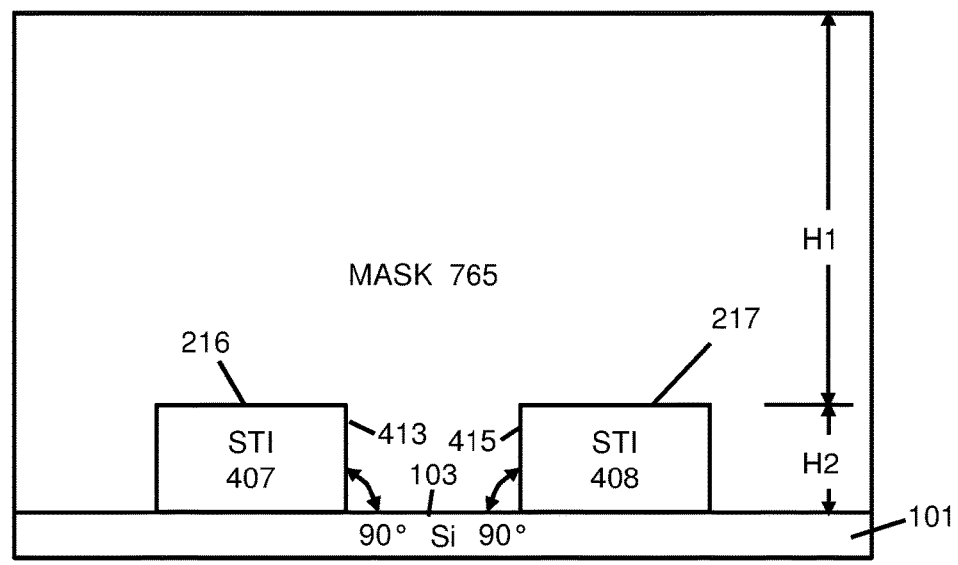
FIG. 8E shows the semiconductor substrate of FIG. 8A after filling in the lower trench having vertical sidewalls with another mask.

For example, FIG. 8E shows the semiconductor substrate of FIG. 8A after filling in the lower trench having vertical sidewalls with another mask, such as described for FIG. 7E filling in trench 205 (or 305) filled with a pattern or masks 765 formed on (e.g., touching) top surfaces 103 of material 102; and surfaces 216 and 216 to a height equal to or above height H1 over surfaces 216 and 216. This may also include filling in trench trench 405 or 505 (e.g., trenches as described for FIGS. 4-5).

Figure 8F:
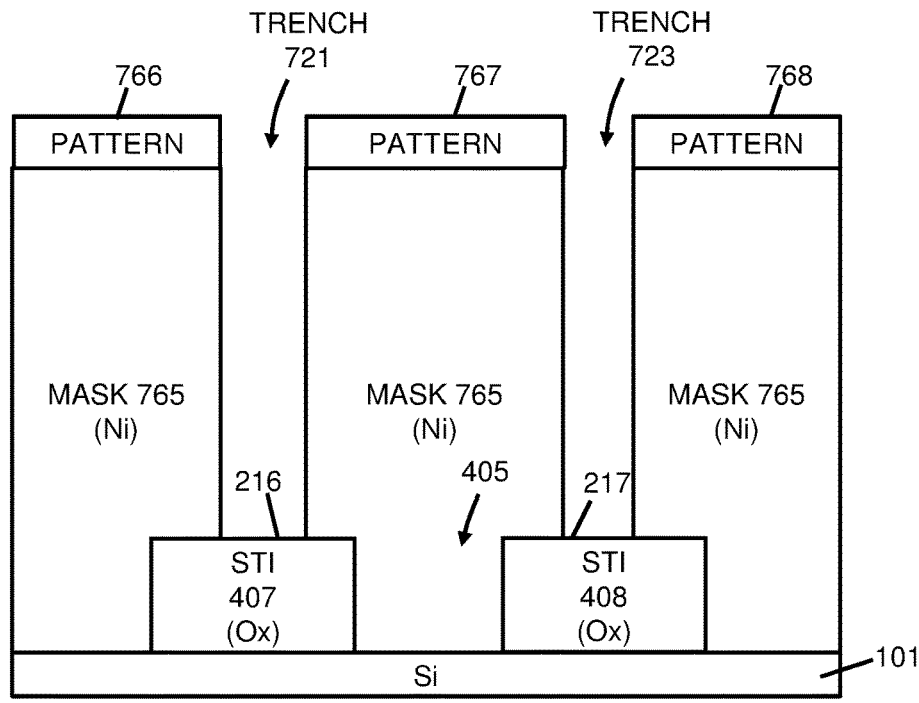
FIG. 8F shows the semiconductor substrate of FIG. 8A after patterning and etching the new, other mask to form openings to the old STI regions, thus creating larger square mesas of the new mask over the lower trench.

FIG. 8F shows the semiconductor substrate of FIG. 8A after patterning and etching the new, other mask to form openings to the old STI regions, thus creating larger square mesas of the new mask over the lower trench.

Figure 8G:
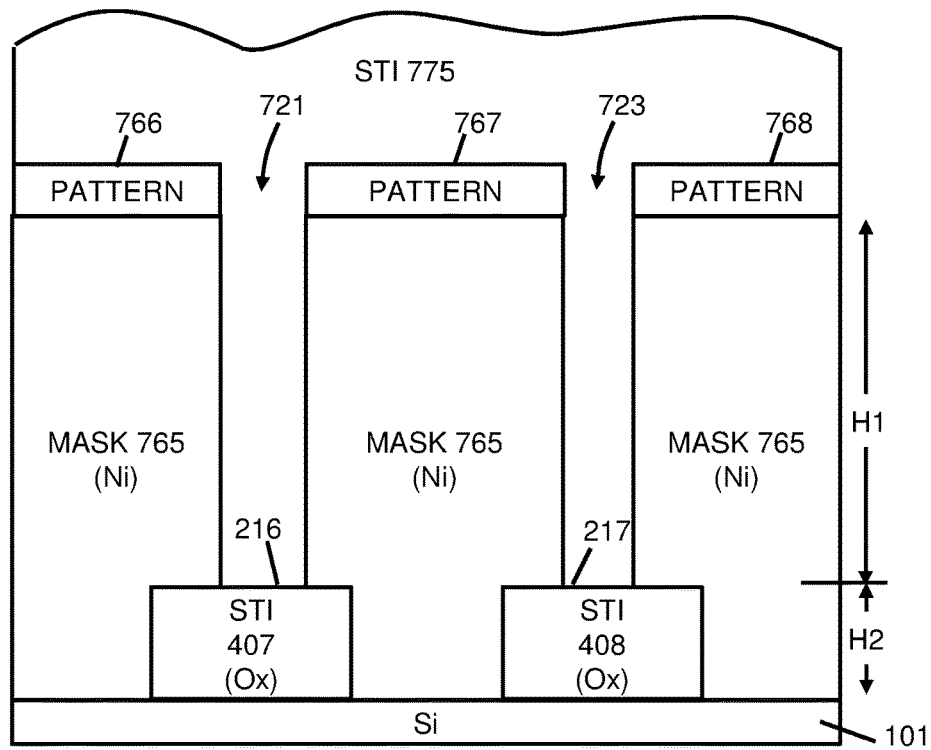
FIG. 8G shows the semiconductor substrate of FIG. 8A after filling the openings to the old STI regions with shallow isolation-oxide (STI) material.

FIG. 8G shows the semiconductor substrate of FIG. 8A after filling the openings to the old STI regions with shallow isolation-oxide (STI) material.

Figure 8H:
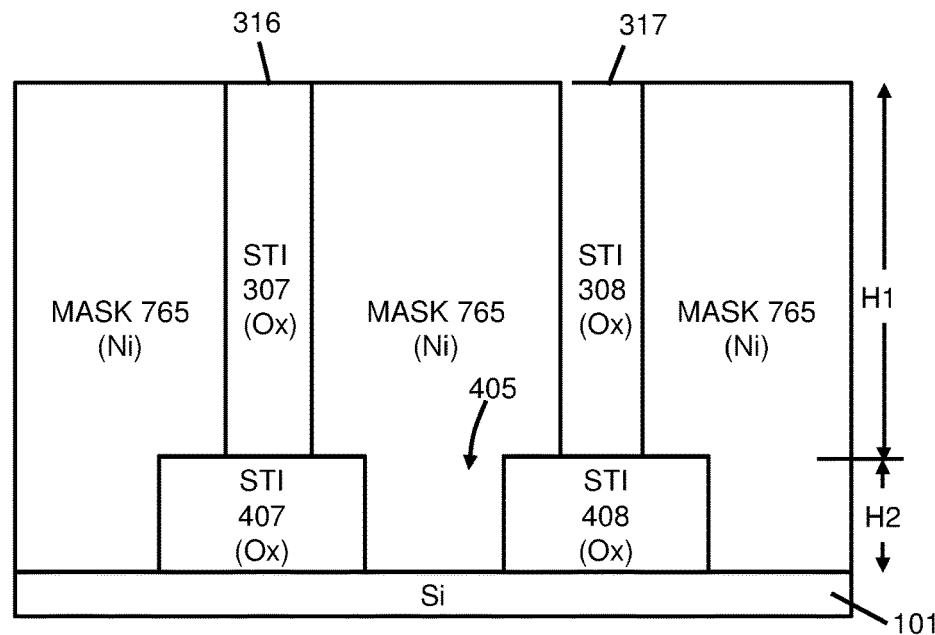
FIG. 8H shows the semiconductor substrate of FIG. 8A after polishing the new STI isolation-oxide to expose the larger square mesas of the new, other mask and the new oxide/STI in the openings to the old STI regions.

FIG. 8H shows the semiconductor substrate of FIG. 8A after polishing the new STI isolation-oxide to expose the larger square mesas of the new, other mask and the new oxide/STI in the openings to the old STI regions.

Figure 8I:
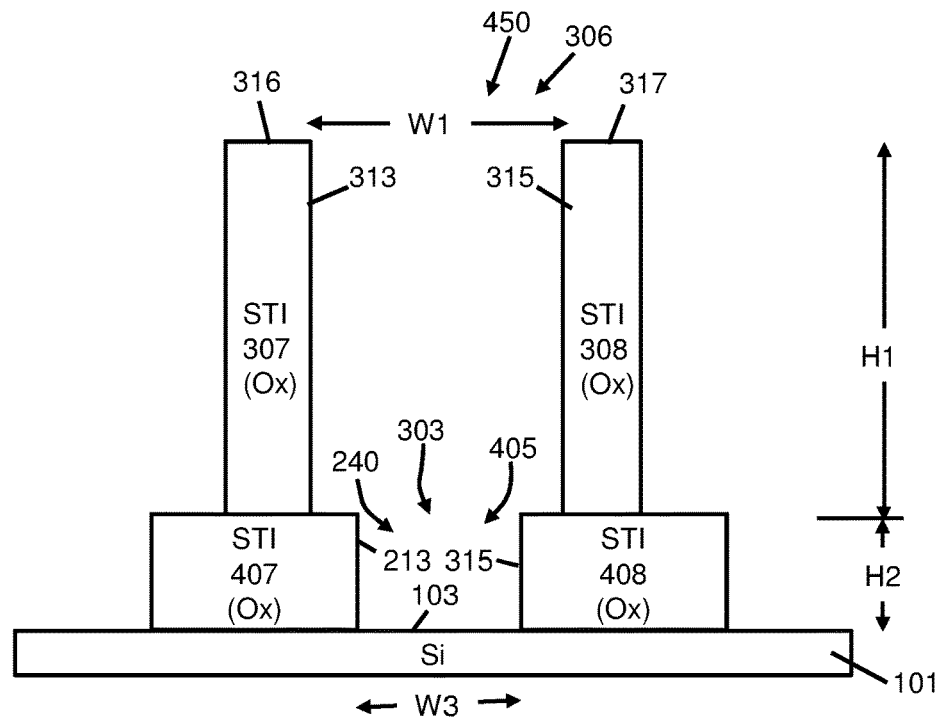
FIG. 8I shows the semiconductor substrate of FIG. 8A after selectively etching or removing the larger square mesas of the new, other mask over the lower trench (e.g., nitride) without removing any new oxide, so that the new oxide in the openings to the old STI regions remains; thus providing an upper trench in oxide with vertical sidewalls and having a lower opening over and surrounding an upper opening of the lower trench.

FIG. 8I shows the semiconductor substrate of FIG. 8A after selectively etching or removing the larger square mesas of the new, other mask over the lower trench (e.g., nitride) without removing any new oxide, so that the new oxide in the openings to the old STI regions remains; thus providing an upper trench in oxide with vertical sidewalls and having a lower opening over and surrounding an upper opening of the lower trench.

FIG. 8I shows trenches 306 and 405 which may be formed by selectively etching mask material 765 with respect to material of STI regions 407, 408, 307 and 308, and substrate material 102; to create or expose trenches 306 and 405 of combined trench 350. Trenches 306 and 405 may be formed by etching to form them separately or simultaneously (e.g., trench 405 is formed during the same etch process or as an immediate chemical etching continuation of etching to form trench 306). This may be done by etching surfaces of mask 765 regions between STI regions 407, 408, 307 and 308 using wet (or optionally, dry) isotropic etching (e.g., no preferential etching along crystallographic planes) similar to descriptions above in FIG. 7I for forming trenches 306 and 305 by etching surfaces of mask 765 regions between STI regions 207, 208, 307 and 308. This etching may also remove height H2 of mask 765 to expose or form top (e.g., planar) surface 103 of material 102, to create trench 405 with vertical sidewalls 413 and 415, and bottom surface 103.

According to embodiments, after FIGS. 8A-I a type III-V or a Germanium (Ge) material may be selectively, epitaxially grown in trench 450 or 550, such as described for FIGS. 4-5 (e.g., materials 222, 432, 322 and 332 for trench 450; or materials 222, 532, 322 and 332 for trench 550).

Figure 9:
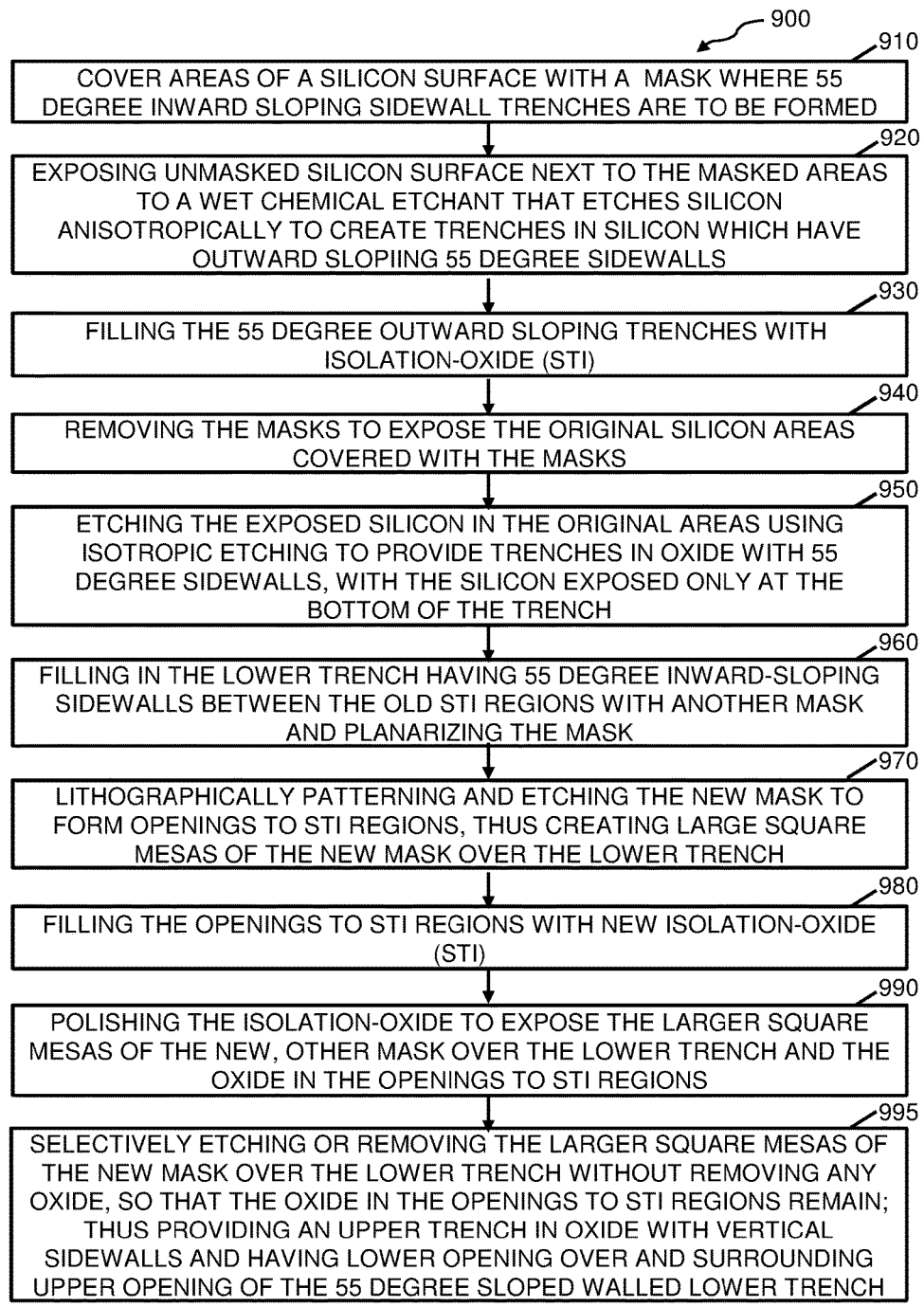
FIG. 9 is an example process for forming a single trench with (or a combined trench having a lower trench with) between 40 degrees and 70 degrees (e.g., such as 55 degrees) inward-sloping sidewalls between STI regions, with a substrate top surface exposed at the bottom of the trench.

FIG. 9 is an example process 900 for forming a trench having between 40 degrees and 70 degrees (e.g., such as 55 degrees) inward-sloping sidewalls between STI regions, with a substrate top surface exposed at the bottom of the trench. FIG. 9 may be an example process for forming trench 205, 305 or 350 as described for FIGS. 2-3.

Block 910 may include covering areas of Silicon of surface 103 where the trenches are to be formed with a mask (e.g., a nitride material).

Block 920 may include exposing unmasked Silicon surface 103 next to the masked areas to a wet chemical etchant that etches silicon anisotropically (along preferred lattice planes), such as using a potassium hydroxide etch (anisotropic wet etch of silicon results in trenches in silicon which have outward sloping between 40 degrees and 70 degrees (e.g., such as 55 degrees) sidewalls (top opening larger than bottom).

Block 930 may include filling the between 40 degrees and 70 degrees (e.g., such as 55 degrees) outward sloping trenches with isolation-oxide (STI).

Block 940 may include removing the masks of the original Si areas covered with the masks to expose the silicon there.

Block 950 may include etching the exposed Si in the original areas using isotropic etching (no preferential etching along crystallographic planes), a dry etch may be used here; thus providing trenches in oxide with between 40 degrees and 70 degrees (e.g., such as 55 degrees) inward-sloping sidewalls, with the silicon exposed only at the bottom of the trench.

Such sidewalls may be sidewalls 213 and 215 of STI regions 207 and 208; or may form trench 205 or 305 as described for FIGS. 2-3, respectively.

In some embodiments, process 900 stops after block 950, such as to form STI regions 207 and 208; or trench 205 as described for FIG. 2. In some embodiments, process 900 continues after block 950 to form STI regions 207, 208, 307 and 308; or combined trench 350 as described for FIG. 3.

Block 960 may include filling in the lower trench having between 40 degrees and 70 degrees (e.g., such as 55 degrees) inward-sloping sidewalls between the old STI regions (e.g., formed at FIG. 7D above) with another mask (e.g., a nitride hardmask) to a height above the sidewalls and planarizing the mask.

Block 970 may include lithographically patterning and etching the new mask to form openings to STI regions 207 and 208, thus creating larger square mesas (larger than the lower trench W2) of the new mask over the lower trench.

Block 980 may include filling the openings to STI regions 207 and 208 with new isolation-oxide (STI).

Block 990 may include polishing the isolation-oxide to expose the larger square mesas of the new, other mask over the lower trench (e.g., nitride) and the oxide in the openings to STI regions 207 and 208.

Block 995 may include selectively etching or removing the larger square mesas of the new mask over the lower trench (e.g., nitride) without removing any oxide, so that the oxide in the openings to STI regions 207 and 208 remains; thus providing an upper trench (e.g., trench 306) in oxide with vertical sidewalls and having lower opening 303 over and surrounding upper opening 240 of sloped walled lower trench 305; and providing a lower trench (e.g., trench 305) in oxide with between 40 degrees and 70 degrees (e.g., such as 55 degrees) inward-sloping sidewalls, with the silicon exposed only at the bottom of the lower trench. Such sidewalls may be sidewalls 213 and 215 of STI regions 207 and 208, and sidewalls 313 and 315 of STI regions 307 and 308; or may form combined trench 350 as described for FIG. 3.

Figure 10:
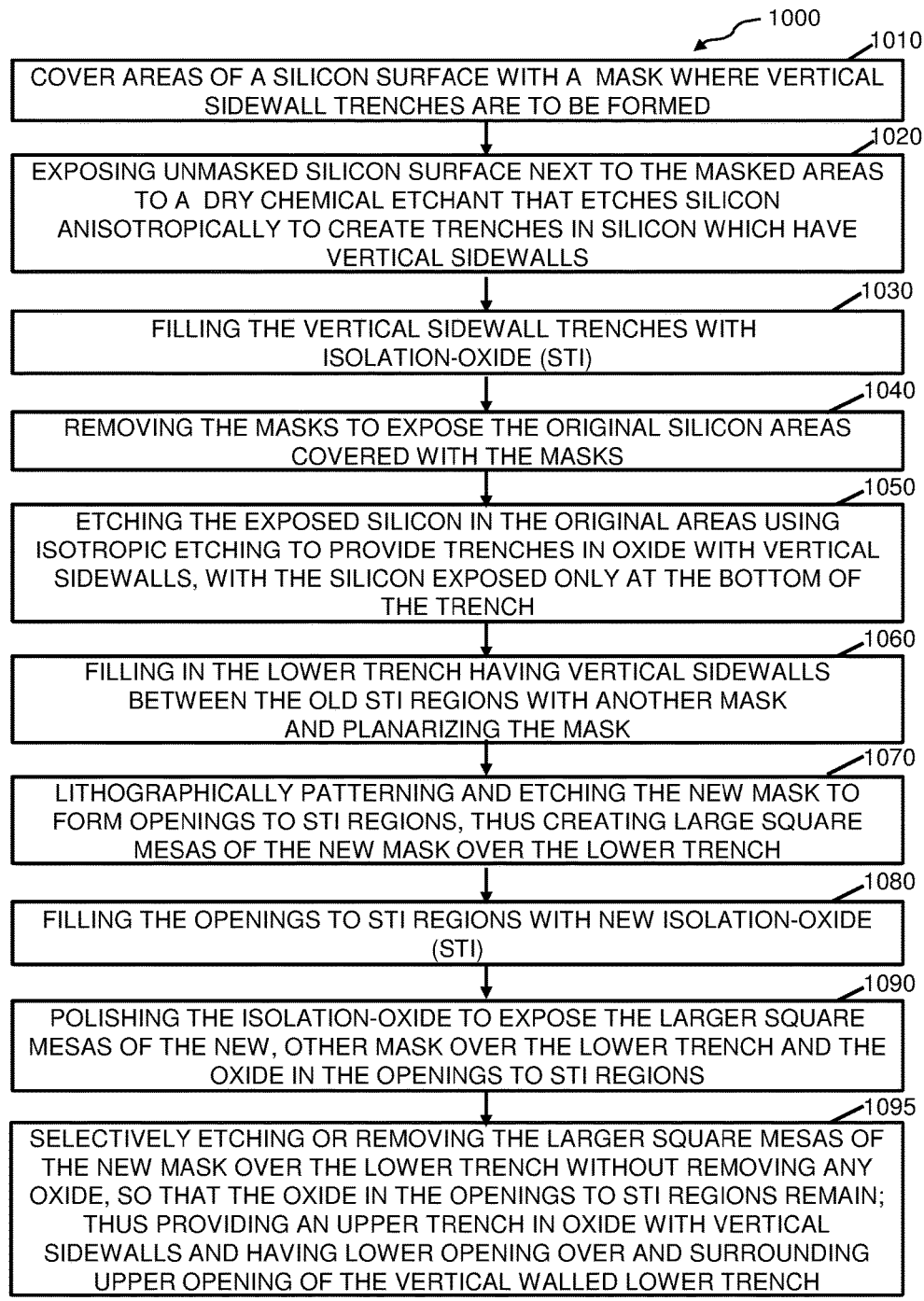
FIG. 10 is an example process for forming a trench vertical sidewalls between STI regions, with a substrate top surface exposed at the bottom of the trench.

FIG. 10 is an example process 1000 for forming a trench vertical sidewalls between STI regions, with a substrate top surface exposed at the bottom of the trench. FIG. 10 may be an example process for forming trench 450 or 550 as described for FIGS. 4-5.

Block 1010 may include covering areas of Silicon of surface 103 where the trenches are to be formed with a mask (e.g., a nitride material).

Block 1020 may include exposing unmasked Silicon surface 103 next to the masked areas to a dry chemical etchant that etches silicon anisotropically (along preferred lattice planes), such as using a Chlorine or another acidic dry chemistry (anisotropic dry etch of silicon) to result in trenches in silicon which have vertical sidewalls (anisotropic dry etch of silicon results in trenches in silicon which have vertical sidewalls (top opening equal to bottom). In some cases, other such chemistries may include a "halogen" to in place of or to supplement the Chlorine. Such a halogen may include Fluorine; or combinations of Clorine and Fluorine.

Block 1030 may include filling the vertical sidewall trenches with isolation-oxide (STI).

Block 1040 may include removing the masks of the original Si areas covered with the masks to expose the silicon there.

Block 1050 may include etching the exposed Si in the original areas using isotropic etching (no preferential etching along crystallographic planes), a dry etch may be used here; thus providing trenches in oxide with vertical sidewalls, with the silicon exposed only at the bottom of the trench.

According to embodiments, such sidewalls may be sidewalls 413 and 415 of STI regions 407 and 408; or may form trench 405 as described for FIG. 4 (e.g., having height H2 as described for FIG. 4). According to other embodiments, such sidewalls may be sidewalls 513 and 515 of STI regions 507 and 508; or may form trench 505 as described for FIG. 5 (e.g., having height H3 as described for FIG. 5).

In some embodiments, process 1000 continues after block 1050 to form STI regions 407, 408, 307 and 308; or combined trench 350 as described for FIG. 4. In some embodiments, process 1000 continues after block 1050 to form STI regions 507, 508, 307 and 308; or combined trench 550 as described for FIG. 5.

Block 1060 may include filling in the lower trench having vertical sidewalls between the old STI regions (e.g., formed at FIG. 8D above) with another mask (e.g., a nitride hardmask) to a height above the sidewalls and planarizing the mask.

Block 1070 may include lithographically patterning and etching the new mask to form openings to STI regions 407 and 408, thus creating larger square mesas (larger than the lower trench W3) of the new mask over the lower trench.

Block 1080 may include filling the openings to STI regions 407 and 408 with new isolation-oxide (STI).

Block 1090 may include polishing the isolation-oxide to expose the larger square mesas of the new, other mask over the lower trench (e.g., nitride) and the oxide in the openings to STI regions 407 and 408.

Block 1095 may include selectively etching or removing the larger square mesas of the new mask over the lower trench (e.g., nitride) without removing any oxide, so that the oxide in the openings to STI regions 407 and 408 remains; thus providing an upper trench (e.g., trench 306) in oxide with vertical sidewalls and having lower opening 303 over and surrounding upper opening 240 of vertical walled lower trench 405; and providing a lower trench (e.g., trench 405) in oxide with vertical sidewalls, with the silicon exposed only at the bottom of the lower trench.

In some embodiments, such sidewalls may be sidewalls 413 and 415 of STI regions 407 and 408, and sidewalls 313 and 315 of STI regions 307 and 308; or may form combined trench 450 as described for FIG. 4 (e.g., where the heigh of regions 407 and 408 is H2). In other embodiments, such sidewalls may be sidewalls 513 and 515 of STI regions 507 and 508, and sidewalls 313 and 315 of STI regions 307 and 308; or may form combined trench 550 as described for FIG. 5 (e.g., where the heigh of regions 507 and 508 is H3).

In some cases, materials 122, 222, 232, 322, 332, 432, and 532 are each a layer of InP, GaAs, InGaAs, AlGaAs, InAlAs, GaAsSb, or InP material. In some cases, one of material 122, 222, 232, 322, 332, 432, and 532 is a layer of InP, GaAs, InGaAs, AlGaAs, InAlAs, GaAsSb, or InP material. In some cases, (1) material 122 is a bottom layer of InP or GaAs material; (2) material 232, 432, 532 and 322 are a middle layer of InAlAs material; and (3) material 332 is a top layer of InGaAs material or material 332 is a top layer is a stack of 5-50 nm InGaAs/2 nm InP/20 nm highly doped InGaAs material (with Indium composition from 53% to 100% in InGaAs). In some cases, (1) material 122, 232, 432 are 532 are a bottom layer of InP or GaAs material; (2) material 322 is a middle layer of InAlAs material; and (3) material 332 is a top layer of InGaAs material or material 332 is a top layer is a stack of 5-50 nm InGaAs/2 nm InP/20 nm highly doped InGaAs material (with Indium composition from 53% to 100% in InGaAs).

In some cases, materials 122, 222, 232, 322, 332, 432, and 532 may be described as an "epitaxial region"; or a "stack" of epitaxial layers or materials. For some embodiments, forming materials 122, 222, 232, 322, 332, 432, and 532 is described as "simultaneously" epitaxially growing the epitaxial materials, layers or regions. For example, "simultaneously" may describe performing, at the same time, the same processes of forming or growing the same materials in different trenches or combined trenches (e.g., between STI regions or sidewalls). In some case, simultaneously epitaxially growing the epitaxial materials may describe performing, at the same time, the same processes of forming the materials multiple trenches on surface 103 as described above.

FIG. 1-10 show one or two single or combined trenches (e.g., trenches 105, 205, 350, 450 and 550) defined between STI regions and surface 103. However it is contemplated that more, similar trenches and STI regions may exist on substrate 101, similar to that of the single or combined trenches (e.g., trenches 105, 205, 350, 450 and 550), such as at least hundreds or hundreds of thousands.

In some cases, a "combined trench" may have two or more levels (e.g., vertically oriented, such as upper v. lower) of trenches that are open to each other (e.g., have lower and upper openings that form an opening between them). In some cases, a "combined trench" may have upper (e.g., top) trench and a lower (e.g., bottom) trench, where the upper trench has a lower opening over and surrounding an upper opening of the lower trench. In some cases, the openings have the same axis or center (e.g., are horizontally centered over each other with respect to Width and Length).

Figure 11:
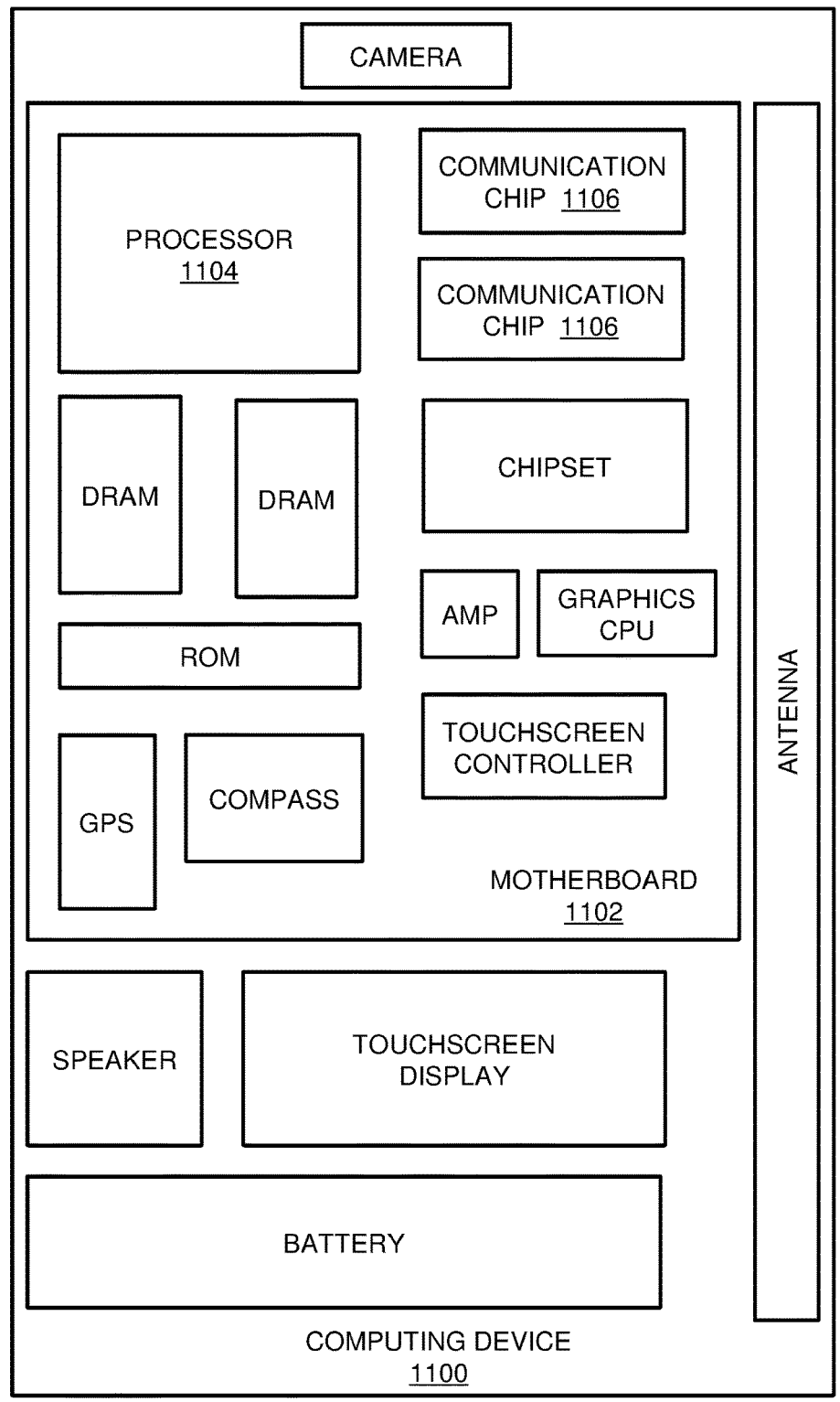
FIG. 11 illustrates a computing device in accordance with one implementation.

FIG. 11 illustrates a computing device 1100 in accordance with one implementation. The computing device 1100 houses board 1102. Board 1102 may include a number of components, including but not limited to processor 1104 and at least one communication chip 1106. Processor 1104 is physically and electrically connected to board 1102. In some implementations at least one communication chip 1106 is also physically and electrically connected to board 1102. In further implementations, communication chip 1106 is part of processor 1104.

Depending on its applications, computing device 1100 may include other components that may or may not be physically and electrically connected to board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1106 enables wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

Processor 1104 of computing device 1100 includes an integrated circuit die packaged within processor 1104. In some implementations, the integrated circuit die includes (1) a trench having sloped sidewalls at an angle of between 40 degrees and 70 degrees (e.g., such as 55 degrees) with respect to a substrate surface the trench is formed on; and/or (2) in a combined trench having an upper trench over and surrounding the opening of a lower trench formed on a substrate surface; and a layer of selectively epitaxially grown buffer material grown from the substrate surface, such as described with reference to FIGS. 1-10. The term "processor" may refer to any device or portion of a device that processes electronic data from registers and/or memory to transform that electronic data into other electronic data that may be stored in registers and/or memory.

Communication chip 1106 also includes an integrated circuit die packaged within communication chip 1106. In accordance with another implementation, a package including a communication chip incorporates one or more capacitors such as described above.

In further implementations, another component housed within computing device 1100 may contain a microelectronic package including an integrated circuit die such as described above.

In various implementations, computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1100 may be any other electronic device that processes data.

EXAMPLES

The following examples pertain to embodiments.

Example 1 is a combined trench for growing a selective epitaxial buffer material, the combined trench comprising: a first and a second shallow trench isolation (STI) region on a substrate surface, the first and second STI regions having first and second STI inner sidewalls defining a lower trench, the lower trench having a bottom surface that is the substrate surface, the lower trench having a lower trench upper opening; and a third and a fourth STI region on the first and second STI regions, the third and fourth STI regions having third and fourth STI inner sidewalls defining an upper trench, the upper trench exposing the lower trench upper opening and the substrate surface; the upper trench having an upper trench lower surface above and completely surrounding the lower trench upper opening.

In Example 2, the subject matter of Example 1 can optionally include wherein the upper trench has a height at least 1.5 times a width and at least 1.5 times a length of the upper trench; and wherein the third and fourth STI inner sidewalls are perpendicular to the substrate surface.

In Example 3, the subject matter of Example 1 can optionally include further comprising: a layer of crystal epitaxial material in the lower trench and in the upper trench, the crystal epitaxial material selectively epitaxially grown from the substrate surface but is not grown from STI top surfaces of the lower trench.

In Example 4, the subject matter of Example 3 can optionally include wherein the layer of crystal epitaxial material is a layer of buffer material and further comprising: a device layer of device crystal epitaxial material on a top surface of the buffer material, the device crystal epitaxial material selectively epitaxially grown from the top surface of the buffer material.

In Example 5, the subject matter of Example 3 can optionally include wherein the epitaxial material has (111) crystal index sidewalls touching the first and second STI inner sidewalls; and wherein the epitaxial material has (110) crystal index vertical sidewalls touching the third and fourth STI inner sidewalls.

In Example 6, the subject matter of Example 1 can optionally include wherein the first and second STI inner sidewalls form an inward angle of between 40 degrees and 70 degrees with respect to the substrate surface.

In Example 7, the subject matter of Example 1 can optionally include wherein the first and second STI inner sidewalls are perpendicular to the substrate surface.

Example 8 is a trench for growing a selective epitaxial buffer material, the trench comprising: a first and a second shallow trench isolation (STI) region on a substrate surface, the first and second STI regions having a first and second STI inner sidewalls defining a trench having a bottom surface that is the substrate surface; the first and second STI inner sidewalls forming an inward angle of approximately 55 degrees with respect to the substrate surface; and a layer of crystal epitaxial material in the trench, the crystal epitaxial material selectively epitaxially grown from the substrate surface.

In Example 9, the subject matter of Example 8 can optionally include wherein the layer of crystal epitaxial material has (111) crystal index material sidewalls touching the first and second STI inner sidewalls.

In Example 10, the subject matter of Example 8 can optionally include wherein the layer of crystal epitaxial material is a layer of buffer material and further comprising: a layer of device crystal epitaxial material on a top surface of the buffer material, the device crystal epitaxial material selectively epitaxially grown from the top surface of the buffer material.

Example 11 is a method to form a trench for growing a selective epitaxial buffer material, the method comprising: forming first and second shallow trench isolation (STI) regions on a substrate surface, the first and second STI regions having first and second STI inner sidewalls defining a trench having a bottom surface that is the substrate surface; the first and second STI inner sidewalls forming an inward angle of 55 degrees with respect to the substrate surface; and selectively epitaxially growing a layer of crystal epitaxial material from the substrate surface and in the trench.

In Example 12, the subject matter of Example 11 can optionally include wherein the layer of crystal epitaxial material has (111) crystal index material sidewalls touching the first and second STI inner sidewalls.

In Example 13, the subject matter of Example 11 can optionally include wherein the layer of crystal epitaxial material is a layer of buffer material and further comprising:

selectively epitaxially growing a device layer of device crystal epitaxial material from a top surface of the buffer material.

Example 14 is a method to form a combined trench for growing a selective epitaxial buffer material, the method comprising: forming first and second shallow trench isolation (STI) regions on a substrate surface, the first and second STI regions having first and second STI inner sidewalls defining a lower trench, the lower trench having a bottom surface that is the substrate surface, the lower trench having a lower trench upper opening; and forming third and fourth STI regions on the first and second STI regions, the third and fourth STI regions having third and fourth STI inner sidewalls defining an upper trench, the upper trench exposing the lower trench upper opening and the substrate surface; the upper trench having an upper trench lower surface above and completely surrounding the lower trench upper opening.

In Example 15, the subject matter of Example 14 can optionally include wherein the upper trench has a height at least 1.5 times a width and at least 1.5 times a length of the upper trench; and wherein the third and fourth STI inner sidewalls are perpendicular to the substrate surface.

In Example 16, the subject matter of Example 14 can optionally include further comprising: selectively epitaxially growing a layer of crystal epitaxial material from the substrate surface, into the lower trench and into the upper trench; and wherein the layer of crystal epitaxial material is not grown from STI top surfaces of the lower trench.

In Example 17, the subject matter of Example 16 can optionally include wherein the layer of crystal epitaxial material is a layer of buffer material and further comprising: a layer of device crystal epitaxial material on a top surface of the buffer material, the device crystal epitaxial material selectively epitaxially grown from the top surface of the buffer material.

In Example 18, the subject matter of Example 16 can optionally include wherein the epitaxial material has (111) crystal index sidewalls touching the first and second STI inner sidewalls; and wherein the epitaxial material has (110) crystal index vertical sidewalls touching the third and fourth STI inner sidewalls.

In Example 19, the subject matter of Example 14 can optionally include wherein the first and second STI inner sidewalls form an inward angle of 55 degrees with respect to the substrate surface.

In Example 20, the subject matter of Example 14 can optionally include wherein the first and second STI inner sidewalls are perpendicular to the substrate surface.

Example 21 is a system for computing comprising: microprocessor coupled to a memory, the microprocessor having at least one combined trench having: a first and a second shallow trench isolation (STI) region on a substrate surface, the first and second STI regions having first and second STI inner sidewalls defining a lower trench, the lower trench having a bottom surface that is the substrate surface, the lower trench having a lower trench upper opening; a third and a fourth STI region on the first and second STI regions, the third and fourth STI regions having third and fourth STI inner sidewalls defining an upper trench, the upper trench open to the lower trench upper opening and the substrate surface; the upper trench having an upper trench lower surface above and completely surrounding the lower trench upper opening; a buffer layer of buffer crystal epitaxial material in the lower trench and in the upper trench, the buffer crystal epitaxial material selectively epitaxially grown from the substrate surface but not grown from STI top surfaces of the lower trench; a device layer of device crystal epitaxial material on a top surface of the buffer material, the device crystal epitaxial material selectively epitaxially grown from the top surface of the buffer material; and a plurality of devices formed in fins of the device material.

In Example 22, the subject matter of Example 21 can optionally include wherein the upper trench has a height at least 1.5 times a width and at least 1.5 times a length of the upper trench; wherein the third and fourth STI inner sidewalls are perpendicular to the substrate surface; wherein the epitaxial material has (110) crystal index vertical sidewalls touching the third and fourth STI inner sidewalls; and wherein one of (a) the epitaxial material has (111) crystal index sidewalls touching the first and second STI inner sidewalls, and (b) the first and second STI inner sidewalls form an inward angle of 55 degrees with respect to the substrate surface.

Example 23 is an apparatus comprising means for performing the method of any one of examples 11-20.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit embodiments of the invention but to illustrate it. The scope of the embodiments of the invention is not to be determined by the specific examples provided above but only by the claims below. In other instances, well-known structures, devices, and operations have been shown in block diagram form or without detail in order to avoid obscuring the understanding of the description. For example, while embodiments are described herein with STI inner sidewalls forming an inward angle of between 40 degrees and 70 degrees with respect to the substrate surface, it is considered that that angle may be approximately 55 degrees, or in some cases, exactly 55 degrees. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above describe forming forming a "combined trench" may having two levels (e.g., 306 and 305, 405 or 505) it is considered that a combined trench may have more than two levels (e.g., vertically oriented, such as upper and lower) of trenches that are open to each other (e.g., have lower and upper openings that form an opening between them). Thus, the claims following the Detailed Description are hereby expressly incorporated into this Detailed Description, with each claim standing on its own as a separate embodiment of the invention.

What is claimed is:

1. An integrated circuit structure, comprising:
a first isolation structure on a substrate, the first isolation structure having an upper portion on a lower portion, the lower portion having a substantially flat surface having a width, and the upper portion having a width on the lower portion less than the width of the substantially flat surface of the lower portion providing exposed portions of the substantially flat surface of the lower portion;
a second isolation structure on the substrate, the second isolation structure having an upper portion on a lower portion, the lower portion having a substantially flat surface having a width, and the upper portion having a width on the lower portion less than the width of the substantially flat surface of the lower portion providing exposed portions of the substantially flat surface of the lower portion;
a first epitaxial semiconductor material laterally directly between the upper portion of the first isolation structure and the upper portion of the second isolation structure, the epitaxial semiconductor material on a portion of the exposed portions of the substantially flat surfaces of the lower portions of the first and second isolation structures, the first epitaxial semiconductor material comprising a fin; and
a second epitaxial semiconductor material below the first epitaxial semiconductor material, the second epitaxial semiconductor material laterally between the upper portion of the first isolation structure and the upper portion of the second isolation structure, wherein the second epitaxial semiconductor material is separate and distinct from the first epitaxial semiconductor material.

2. The integrated circuit structure of claim 1, wherein the substrate is a monocrystalline silicon substrate.

3. The integrated circuit structure of claim 2, wherein the first epitaxial semiconductor material is a group III-V material layer.

4. The integrated circuit structure of claim 2, wherein the first epitaxial semiconductor material is a germanium material layer.

5. The integrated circuit structure of claim 1, further comprising: a first seam between the upper portion and lower portion of the first isolation structure; and a second seam between the upper portion and lower portion of the second isolation structure.

6. The integrated circuit structure of claim 1, wherein the second epitaxial semiconductor material is on a second portion of the exposed portions of the substantially flat surfaces of the lower portions of the first and second isolation structures, the second epitaxial semiconductor material comprising a pyramidal top surface, wherein the epitaxial semiconductor material is on the pyramidal top surface of the second epitaxial semiconductor material.

7. The integrated circuit structure of claim 6, further comprising:
a third epitaxial semiconductor material below the second epitaxial semiconductor material, the third epitaxial semiconductor material laterally between the lower portion of the first isolation structure and the lower portion of the second isolation structure, the third epitaxial semiconductor material, the third epitaxial semiconductor material comprising a pyramidal top surface above the substantially flat surfaces of the lower portions of the first and second isolation structures, wherein the second epitaxial semiconductor material is on the pyramidal top surface of the third epitaxial semiconductor material.

8. The integrated circuit structure of claim 7, further comprising:
a fourth epitaxial semiconductor material below the third epitaxial semiconductor material, the fourth epitaxial semiconductor material laterally between the lower portion of the first isolation structure and the lower portion of the second isolation structure, the third epitaxial semiconductor material, the third epitaxial semiconductor material comprising a pyramidal top surface, wherein the third epitaxial semiconductor material is on the pyramidal top surface of the fourth epitaxial semiconductor material.

9. The integrated circuit structure of claim 8, wherein the fourth epitaxial semiconductor material is on the substrate, and wherein a portion of the third epitaxial semiconductor material is on the substrate.

10. The integrated circuit structure of claim 1, wherein the lower portions of the first and second isolation structures comprises substantially vertical sidewalls.

* * * * *